(12) United States Patent
Lee et al.

(10) Patent No.: US 11,785,824 B2
(45) Date of Patent: Oct. 10, 2023

(54) DISPLAY DEVICE AND MANUFACTURING METHOD THEREOF

(71) Applicant: Samsung Display Co., Ltd., Yongin-si (KR)

(72) Inventors: Jin Woo Lee, Yongin-si (KR); Sang Ho Park, Yongin-si (KR); Tae Hoon Yang, Yongin-si (KR); Jin Yeong Kim, Yongin-si (KR); Jin Taek Kim, Yongin-si (KR); Soo Hyun Moon, Yongin-si (KR); Mi Jin Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 129 days.

(21) Appl. No.: 17/148,321

(22) Filed: Jan. 13, 2021

(65) Prior Publication Data

US 2021/0335892 A1 Oct. 28, 2021

(30) Foreign Application Priority Data

Apr. 27, 2020 (KR) .......................... 10-2020-0050970

(51) Int. Cl.
*H01L 25/075* (2006.01)
*H10K 59/38* (2023.01)
(Continued)

(52) U.S. Cl.
CPC ........... *H10K 59/38* (2023.02); *H10K 50/813* (2023.02); *H10K 50/822* (2023.02);
(Continued)

(58) Field of Classification Search
CPC ............... H01L 27/322; H01L 27/3258; H01L 51/5209; H01L 51/5225; H01L 51/5253;
(Continued)

(56) References Cited

U.S. PATENT DOCUMENTS

| 10,658,605 B2 | 5/2020 | Lee et al. |
| 2020/0013766 A1 | 1/2020 | Kim |

(Continued)

FOREIGN PATENT DOCUMENTS

| KR | 10-2019-0029831 A | 3/2019 |
| KR | 10-2020-0005692 A | 1/2020 |
| KR | 10-2020-0006651 A | 1/2020 |

OTHER PUBLICATIONS

Chen, Jian et al., "Quantum-Dot Displays: Giving LCDs a Competitive Edge Through Color", SID Information Display, Jan. 2013, vol. 29, Issue 1, pp. 12-17 (7 pp downloaded Oct. 22, 2020) URL: http://archive.informationdisplay.org/id-archive/2013/january-february/frontline-technology-quantum-dot-displays.

*Primary Examiner* — Kevin Quarterman
(74) *Attorney, Agent, or Firm* — Lewis Roca Rothgerber Christie LLP

(57) ABSTRACT

A display device includes a first substrate including a plurality of unit light emitting areas; a first electrode and a second electrode in each of the unit light emitting areas of the first substrate; a first insulation layer exposing one region of each of the first electrode and the second electrode; a light emitting element on the first insulation layer and having a first end and a second end in a length direction; light conversion patterns adjacent to the light emitting element, covering a portion of an upper surface of the light emitting element, and exposing the first and second ends of the light emitting element; a first contact electrode on the first electrode and connecting the one region of the exposed first electrode and the first end of the light emitting element; and a second contact electrode on the second electrode.

14 Claims, 26 Drawing Sheets

(51) Int. Cl.
*H10K 50/813* (2023.01)
*H10K 50/822* (2023.01)
*H10K 50/844* (2023.01)
*H10K 59/124* (2023.01)
*H10K 71/00* (2023.01)

(52) U.S. Cl.
CPC ......... *H10K 50/844* (2023.02); *H10K 59/124* (2023.02); *H10K 71/00* (2023.02)

(58) Field of Classification Search
CPC ............ H01L 51/56; H01L 2933/0091; H01L 25/0753; H01L 25/167; H01L 33/58; H01L 33/504; H01L 27/3248; H01L 27/156; H01L 27/124; H01L 27/1248; H01L 33/50; H01L 33/52; G09G 3/32
See application file for complete search history.

(56) References Cited

U.S. PATENT DOCUMENTS

| | | | |
|---|---|---|---|
| 2020/0075814 A1* | 3/2020 | Park | H01L 25/0753 |
| 2020/0083303 A1* | 3/2020 | Bok | H01L 51/5203 |
| 2021/0217739 A1* | 7/2021 | Lee | H01L 33/50 |
| 2021/0327865 A1* | 10/2021 | Yamazaki | H01L 27/124 |
| 2021/0351171 A1* | 11/2021 | Yoo | H01L 27/1214 |
| 2022/0037568 A1* | 2/2022 | Kwag | H01L 27/156 |
| 2022/0068901 A1* | 3/2022 | Kong | H01L 27/1248 |
| 2022/0077228 A1* | 3/2022 | Do | H01L 25/0753 |
| 2022/0115470 A1* | 4/2022 | Kim | H01L 27/1214 |
| 2022/0262984 A1* | 8/2022 | Choi | H01L 25/0753 |

* cited by examiner

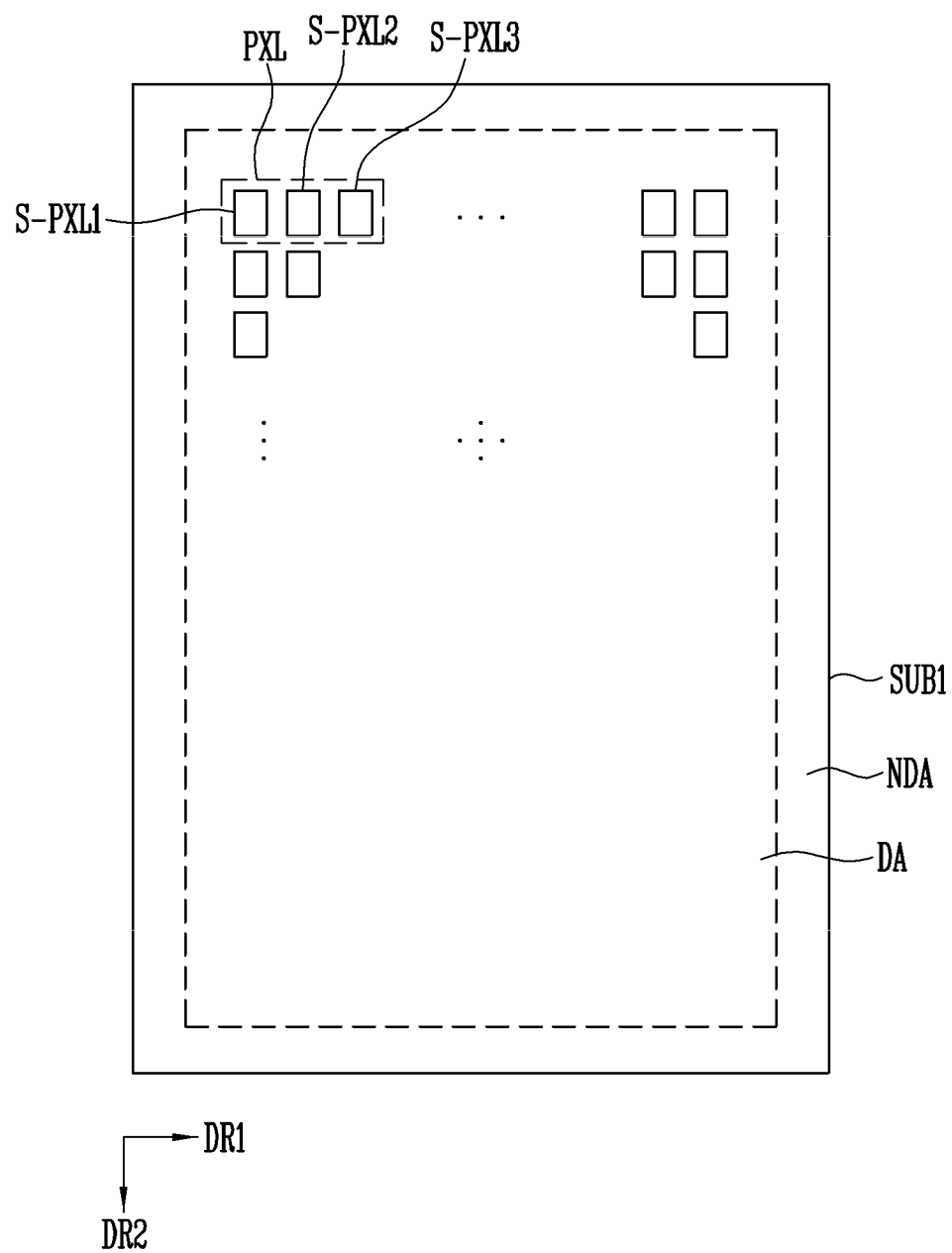

DISPLAY DEVICE AND MANUFACTURING METHOD THEREOF

CROSS-REFERENCE TO RELATED APPLICATION

This application claims priority to and the benefit of Korean Patent Application No. 10-2020-0050970, filed on Apr. 27, 2020, the entire content of which is herein incorporated by reference.

BACKGROUND

1. Field

The present disclosure relates a display device and a manufacturing method thereof.

2. Description of the Related Art

Technology for manufacturing an ultra-small light emitting element using a material with a highly reliable inorganic crystal structure and a display device using the light emitting element, have been developed. For example, technology for constructing a light source of a display device using ultra-small light emitting elements having a small size, such as, nano-scale to micro-scale size, has been developed.

In order to apply the ultra-small light emitting elements to the display device, an electrode capable of applying power may be connected to the light emitting elements, and an insulation layer (or anchor) for preventing a short circuit between the electrodes having different polarities and for preventing movement of the light emitting elements, may be located on the light emitting elements.

Recently, it has been studied to apply a color filter including a light conversion layer to improve image quality, such as, color reproducibility of a display device. In some cases, a blue light source is used as a light source, and it is converted to any one of red, green, and white light through the light conversion layer.

SUMMARY

One or more example embodiments of the present disclosure provide a display device with reduced manufacturing cost and a reduced number of manufacturing processes.

One or more example embodiments of the present disclosure provide a display device capable of reducing a thickness of a display panel while preventing (or reducing) deterioration of image quality such as color reproducibility.

The aspects of the present disclosure are not limited to the aspects mentioned above, and other technical objects that are not mentioned may be clearly understood to a person of an ordinary skill in the art using the following description.

A display device according to one or more example embodiments of the present disclosure includes a first substrate including a plurality of unit light emitting areas; a first electrode and a second electrode in each of the unit light emitting areas of the first substrate; a first insulation layer exposing one region of each of the first electrode and the second electrode; a light emitting element on the first insulation layer and including a first end and a second end in a length direction; light conversion patterns adjacent to the light emitting element, covering a portion of an upper surface of the light emitting element, and exposing the first and second ends of the light emitting element; a first contact electrode on the first electrode and connecting the one region of the exposed first electrode and the first end of the light emitting element; and a second contact electrode on the second electrode and connecting the one region of the exposed second electrode and the second end of the light emitting element.

The unit light emitting areas may include a first light emitting area, a second light emitting area and a third light emitting area, and a first color light may be emitted from the first light emitting area, a second color light may be emitted from the second light emitting area, and a third color light may be emitted from the third light emitting area.

The light conversion patterns may include a first light conversion pattern overlapping the first light emitting area in a thickness direction and including a first wavelength conversion particle, a second light conversion pattern overlapping the second light emitting area in the thickness direction and including a second wavelength conversion particle, and a first scattering pattern overlapping the third light emitting area in the thickness direction and including a scattering particle.

The first light conversion pattern may convert the first color light to the second color light, and output the second color light, and the second light conversion pattern may convert the second color light to the third color light, and output the third color light.

The display device may further include an encapsulation layer on the first electrode, the second electrode, the light emitting element, and the light conversion patterns.

The display device may further include a second substrate opposite the first substrate, wherein the second substrate may include a first color filter overlapping the first light emitting area in the thickness direction and may pass the second color light, a second color filter overlapping the second light emitting area in the thickness direction and may pass the third color light, and a third color filter overlapping the third light emitting area in the thickness direction and may pass the first color light.

The display device may further include a filler located between the first substrate and the second substrate.

The second substrate may include a light blocking pattern between adjacent once of the first color filter, the second color filter and the third color filter.

A size of the first wavelength conversion particle may be larger than a size of the second wavelength conversion particle.

The display device may further include first bank patterns in the unit light emitting areas of the first substrate and spaced from each other, wherein the first electrode and the second electrode are located on the first bank patterns.

The light conversion patterns may further include side light conversion patterns on one side of the first bank patterns facing each other, and are interposed between the first electrode and the first contact electrode and between the second electrode and the second contact electrode.

The light conversion patterns are further located between the first insulation layer and a lower surface of the light emitting element.

The display device may further include a dummy electrode on an upper surface of the light conversion patterns overlapping the light emitting element in a thickness direction, and electrically and physically separated from the first and second contact electrodes.

The light conversion patterns located to overlap the light emitting element in a thickness direction may have a cross-section of an inverted trapezoid shape where an upper width in the length direction is larger than a lower width in the length direction.

A manufacturing method of a display device according to one or more example embodiments of the present disclosure includes providing a first substrate including a plurality of unit light emitting areas; forming a first electrode and a second electrode spaced from each other at a same plane as the first electrode in each of the unit light emitting areas; forming a first insulation material layer on the first and second electrodes; putting a solution including a plurality of light emitting elements on the first insulation material layer, and self-aligning the light emitting elements between the first and second electrodes; forming a light conversion pattern exposing a first end and a second end of each light emitting elements by patterning after applying a light conversion material layer on the first insulation material layer; patterning the first insulation material layer to expose one region of the first electrode and the second electrode; and concurrently forming (e.g., simultaneously forming) a first contact electrode connecting the first end of each exposed light emitting elements and the first electrode, and a second contact electrode connecting the second end of each exposed light emitting element and the second electrode.

The manufacturing method may further includes forming first bank patterns spaced from each other in each of the unit light emitting areas, wherein the first electrode and the second electrode are located on the first bank patterns.

The providing the first substrate may include forming at least one transistor to drive the light emitting elements on the first substrate; and forming a protective layer on the at least one transistor.

In the forming the light conversion pattern by patterning after applying the light conversion material layer on the first insulation material layer, side light conversion patterns on one side of the first bank patterns facing each other may be concurrently formed (e.g., simultaneously formed).

The providing the first substrate may include forming a first light emitting area to emit a first color light, a second light emitting area to emit a second color light, and a third light emitting area to emit third color light.

The forming the light conversion pattern may include forming a first light conversion pattern overlapping the first light emitting area in a thickness direction and including a first wavelength conversion particle, forming a second light conversion pattern overlapping the second light emitting area in the thickness direction and including a second wavelength conversion particle, and forming a first scattering pattern overlapping the third light emitting area in the thickness direction and including a scattering particle.

Particularities of other embodiments are included in the detailed description and drawings.

In a display device according to one or more example embodiments, manufacturing cost and the number of processes can be reduced by forming an anchor that prevents light emitting elements from deviating from an aligned position of a light conversion pattern.

In one or more example embodiments, because a separate light conversion layer can be omitted on a color filter layer, it is possible to reduce a thickness of a display panel while preventing (or reducing) deterioration of image quality such as color reproducibility.

Effects of example embodiments of the present disclosure are not limited by what is illustrated in the above, and more various effects are included in the present specification.

BRIEF DESCRIPTION OF THE DRAWINGS

FIG. 4 shows a display device according to an one or more example embodiments of the present disclosure, and is a schematic top plan view of a display device using any one of the light emitting elements shown in FIGS. 1A, 1B, 2A, 2B, 3A, and 3B as a light emitting source.

DETAILED DESCRIPTION

Figure 1A:
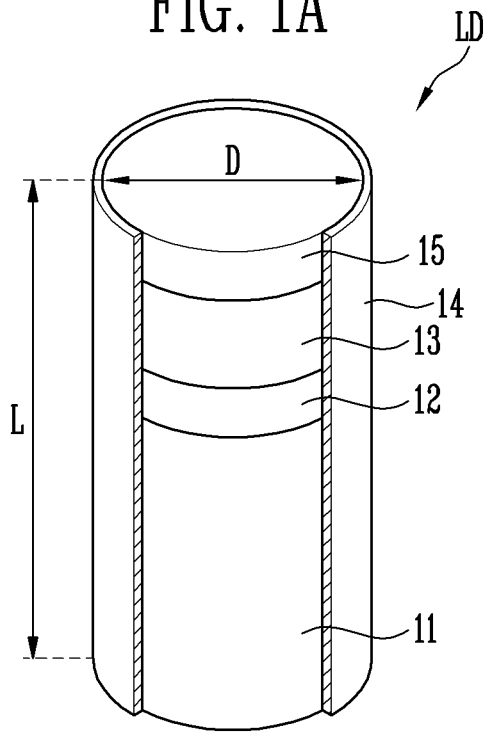
FIG. 1A is a perspective cutaway view schematically showing a light emitting element according to one or more example embodiments of the present disclosure.

Features and aspects of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are discussed so that this disclosure will be thorough and complete, and will fully convey the scope of the present disclosure to those skilled in the art. Further, the present disclosure is defined by scopes of claims, and their equivalents.

It will be understood that when an element or a layer is referred to as being 'on' another element or layer, it can be directly on another element or layer, or intervening element or layer may also be present. The same reference numerals designate the same elements throughout the specification. The shapes, sizes, ratios, angles, numbers, and the like disclosed in the drawings for describing embodiments of the present disclosure are illustrative, and thus the present disclosure is not limited to the illustrated embodiments.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure.

Each of the features of the various embodiments of the present disclosure may be coupled or combined with each other partly or entirely, and may be technically variously interlocked and driven in a manner that is sufficiently understandable to those skilled in the art. Each embodiment may be practicable independently of each other and may be practicable with together in an interrelationship.

Hereinafter, referring to the accompanying drawings, one or more example embodiments of the present disclosure will be described in further detail.

Figure 1B:
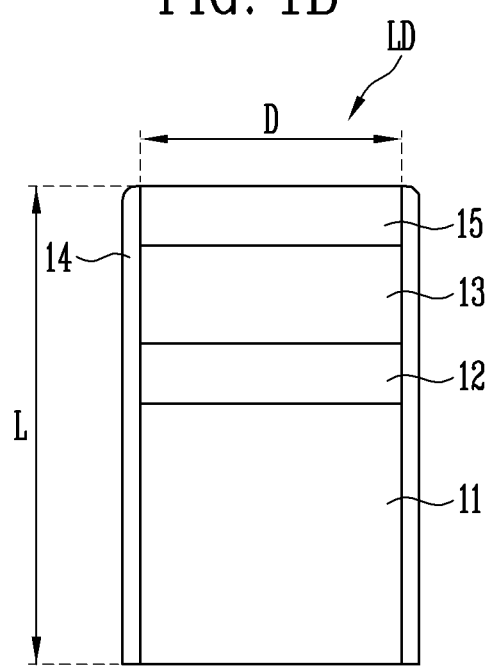
FIG. 1B is a cross-sectional view of the light emitting element of FIG. 1A.
Figure 2A:
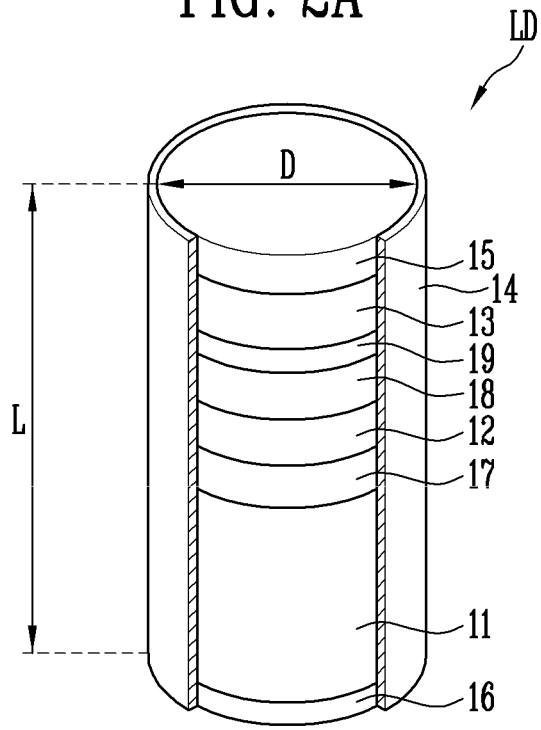
FIG. 2A is a perspective cutaway view schematically showing a light emitting element according to one or more example embodiments of the present disclosure.
Figure 2B:
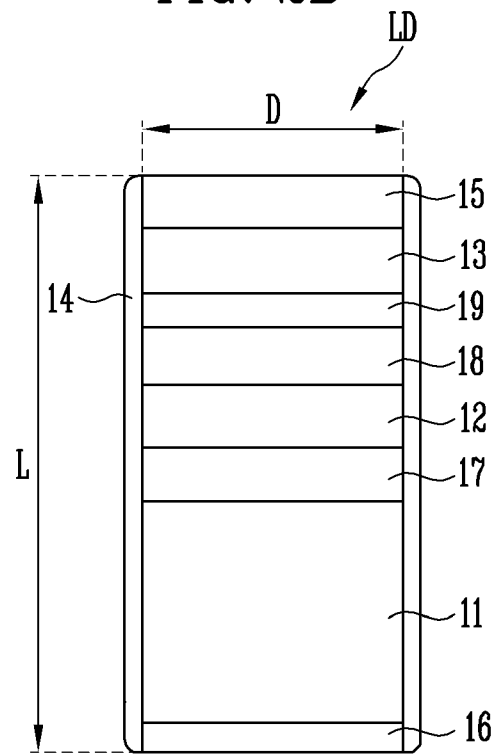
FIG. 2B is a cross-sectional view of the light emitting element of FIG. 2A.
Figure 3A:
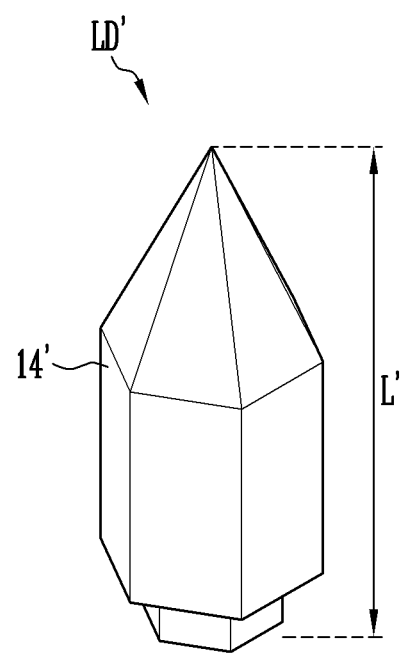
FIG. 3A is a perspective view schematically showing a light emitting element according to another example embodiment of the present disclosure.

FIG. 1A is a perspective cutaway view schematically showing a light emitting element according to one or more example embodiments of the present disclosure, and FIG. 1B is a cross-sectional view of the light emitting element of FIG. 1A. FIG. 2A is a perspective cutaway view schematically showing a light emitting element according to one or more example embodiments of the present disclosure, and FIG. 2B is a cross-sectional view of the light emitting element of FIG. 2A. FIG. 3A is a perspective view schematically showing a light emitting element according to another example embodiment of the present disclosure, and FIG. 3B is a cross-sectional view of the light emitting element of FIG. 3A.

Figure 3B:
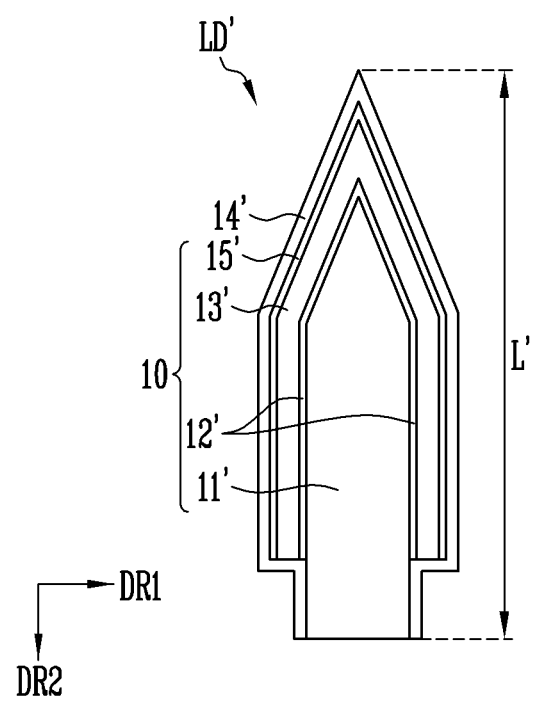
FIG. 3B is a cross-sectional view of the light emitting element of FIG. 3A.

For convenience, FIGS. 1A, 1B, 2A, and 2B showing light emitting elements manufactured by an etching method will be described, and then FIGS. 3A and 3B showing light emitting elements manufactured by a growth method will be described. In one or more example embodiments of the present disclosure, a type and/or shape of the light emitting element is not limited to example embodiments shown in FIGS. 1A, 1B, 2A, 2B, 3A, and 3B.

First, referring to FIGS. 1A, 1B, 2A, and 2B, the light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stacking member in which the first semiconductor layer 11, the active layer 12, and the second semiconductor layer 13 are sequentially stacked.

According to one or more example embodiments of the present disclosure, the light emitting element LD may be provided in a shape extending in one direction. When an extending direction of the light emitting element LD is referred to as a length direction, the light emitting element LD may have one end and the other end in the extending direction. One of the first and second semiconductor layers 11 and 13 may be located on one end of the light emitting element LD, and the other one of the first and second semiconductor layers 11 and 13 may be located on the other end of the light emitting element LD.

The light emitting element LD may be provided in various shapes. For example, the light emitting element LD may have a rod-like shape or a bar-like shape that is longer in the length direction (i.e., aspect ratio greater than one). In one or more example embodiments of the present disclosure, a length L of the light emitting element LD in the length direction may be greater than a diameter D (or width of transverse cross-section) thereof. The light emitting element LD may include a light emitting diode manufactured in an ultra-small size to have a diameter D and/or length L of a micro-scale or nano-scale. In one or more example embodiments of the present disclosure, a size of the light emitting element LD may be changed so that the light emitting element LD may meet a required condition (or design condition) of a lighting device or a self-luminous display device to be applied.

The first semiconductor layer 11 may include at least one n-type semiconductor layer. For example, the first semiconductor layer 11 may include any one semiconductor material of InAlGaN, GaN, AlGaN, InGaN, AlN, and InN, and may include an n-type semiconductor layer doped with a first conductive dopant such as Si, Ge, Sn, and the like. However, the material constituting the first semiconductor layer 11 is not limited thereto, and various other materials may constitute the first semiconductor layer 11.

The active layer 12 may be located on the first semiconductor layer 11, and may be formed in a single or multiple quantum well structure. A position of the active layer 12 may be variously changed according to the type of light emitting element LD. The active layer 12 may emit light having a wavelength of 400 nm to 900 nm, and may use a double heterostructure. In one or more example embodiments of the present disclosure, a cladding layer (not shown) doped with conductive dopant may be formed on an upper and/or lower portion of the active layer 12. For example, the clad layer may be formed of an AlGaN layer or an InAlGaN layer. According to one or more example embodiments, the material such as AlGaN, AlInGaN, and the like may be used to form the active layer 12, and various materials may constitute the active layer 12.

When an electric field having a suitable voltage (e.g. a set voltage or a predetermined voltage) or more is applied between end portions of the light emitting element LD, the light emitting element LD emits light while electron-hole pairs are combined in the active layer 12. By controlling a light emission of the light emitting element LD using this principle, the light emitting element LD may be used as a light source for various light emitting devices as well as a pixel of a display device.

The second semiconductor layer 13 may be located on the active layer 12, and may include a semiconductor layer of a different type from the first semiconductor layer 11. For example, the second semiconductor layer 13 may be formed of a semiconductor material different from the semiconductor material of the first semiconductor layer 11, or the second semiconductor layer 13 may be formed of a semiconductor material having material properties that are different from material properties of the semiconductor material of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, and InN, and may include a p-type semiconductor layer doped with a second conductive dopant such as Mg and the like. However, the material constituting the second semiconductor layer 13 is not limited thereto, and various other materials may constitute the second semiconductor layer 13.

In one or more example embodiments of the present disclosure, the first semiconductor layer 11 and the second semiconductor layer 13 may have different widths (or thicknesses) in the length direction of the light emitting element LD. For example, the first semiconductor layer 11 may have a wider width (or thicker thickness) than the second semiconductor layer 13 in the length direction of the light emitting element LD. Accordingly, as shown in FIGS. 1A-3B, the active layer 12 of the light emitting element LD may be located closer to the upper surface of the second semiconductor layer 13 than the lower surface of the first semiconductor layer 11.

According to one or more example embodiments of the present disclosure, as shown in FIGS. 1A and 1B, the light emitting element LD may further include an added electrode 15 located on the second semiconductor layer 13 from among the first semiconductor layer 11, the active layer 12, and the second semiconductor layer 13 described above. In one or more example embodiments, as shown in FIGS. 2A and 2B, the light emitting element LD may further include another added electrode 16 located on one end of the first semiconductor layer 11.

The added electrodes 15 and 16 may be an ohmic contact electrode, but are not limited thereto, and may be a Schottky contact electrode according to one or more example embodiments. The added electrodes 15 and 16 may include metal or metal oxide, for example, chromium (Cr), titanium (Ti), aluminum (Al), gold (Au), nickel (Ni), ITO and oxide or alloy thereof alone or in combination, but is not limited thereto.

The material included in each of the added electrodes 15 and 16 may be the same as or different from each other. The added electrodes 15 and 16 may be substantially transparent or translucent. Accordingly, the light generated by the light emitting element LD may transmit through the added electrodes 15 and 16 to be emitted outside the light emitting element LD. According to one or more example embodiments, when the light generated from the light emitting element LD is emitted outside the light emitting element LD through an area excluding both ends of the light emitting element LD without transmitting through the added electrodes 15, 16, the added electrodes 15 and 16 may include an opaque metal.

In one or more example embodiments of the present disclosure, the light emitting element LD may further include an insulation film 14. However, according to one or more example embodiments, the insulation film 14 may be omitted, and may be provided to cover only a portion of the first semiconductor layer 11, the active layer 12, and the second semiconductor layer 13.

The insulation film 14 may prevent (or protect from) an electric short that may occur when the active layer 12 contacts a conductive material other than the first semiconductor layer 11 and the second semiconductor layer 13. In one or more embodiments, by forming the insulation film 14, a surface defect of the light emitting element LD may be minimized or reduced to improve life-span and efficiency. In one or more embodiments, when a plurality of light emitting elements LD are closely located, the insulation film 14 may prevent (or protect from) an unwanted short that may occur between the light emitting elements LD. If the short may be prevented between the active layer 12 and an external conductive material, whether or not the insulation film 14 is provided is not limited.

As shown in FIGS. 1A and 2A, the insulation film 14 may be provided in a form partially or entirely covering an outer surface (e.g., an outer peripheral surface or an outer circumferential surface) of the light emitting stacking member including the first semiconductor layer 11, the active layer 12, the second semiconductor layer 13, and the added electrode 15. For better understanding and ease of description, FIGS. 1A and 2A shows a state removing a portion of the insulation film 14, and the first semiconductor layer 11, the active layer 12, the second semiconductor layer 13, and the added electrode 15 included in the real light emitting element LD may be covered by (or partially covered by) the insulation film 14.

As shown in FIG. 1B, the insulation film 14 may have a curved shape in a corner portion adjacent to the added electrode 1. According to one or more example embodiments, the curved surface may be formed due to an etching method when the light emitting element LD is manufactured.

As shown in FIG. 2B, the light emitting element structure of the example embodiment including the insulation film 14 and the added electrode 16 located on the first semiconductor layer 11, may also have a curved shape in a portion adjacent to the added electrode 16.

According to one or more example embodiments of the present disclosure, the insulation film 14 may include a transparent insulation material. For example, the insulation film 14 may include at least one insulation material selected from the group consisting of $SiO_2$, $Si_3N_4$, $Al_2O_3$ and $TiO_2$, but is not limited thereto, and may include various materials having an insulation property.

In one or more embodiments, referring to FIGS. 2A and 2B, a light emitting element LD according to one or more example embodiments may further include a third semiconductor layer 17 located between the first semiconductor layer 11 and the active layer 12, a fourth semiconductor layer 18 and a fifth semiconductor layer 19 located between the active layer 12 and the second semiconductor layer 13. The light emitting elements LD of FIGS. 2A and 2B are different from an example embodiment of FIGS. 1A and 1B in that a plurality of semiconductor layer 17, 18, and 19 and added electrode 16 are further located and the active layer 12 includes other elements.

According to one or more example embodiments of the present disclosure, in the light emitting element LD of FIGS. 1A and 1B, the active layer 12 may emit blue or green light because the active layer includes nitrogen (N). On the other hand, in the light emitting element LD of FIGS. 2A and 2B, each of the active layer 12 and other semiconductor layers may include semiconductors including at least phosphorus (P). For example, the light emitting element LD according to one or more example embodiments can emit red light of which a central wavelength band has a range of 620 nm to 750 nm. However, it should be understood that the central wavelength band of red light is not limited to the above-described range, and includes all wavelength ranges that can be recognized as red in the art.

For example, in the light emitting element LD according to the example embodiment of FIGS. 2A and 2B, the first semiconductor layer 11 may be an n-type semiconductor layer, and when the light emitting element LD emits red light, the first semiconductor layer 11 may include a semiconductor material having a chemical formula of $In_xAl_yGa_{1-x-y}P$ ($0 \le x \le 1$, $0 \le y \le 1$, $0 \le x+y \le 1$). For example, the first semiconductor layer 11 may be at least one of n-type doped InAlGaP, GaP, AlGaP, InGaP, AlP, and InP. The first semiconductor layer 11 may be doped with an n-type dopant, and for example, the n-type dopant may be Si, Ge, Sn, or the like. In one or more example embodiments, the first semiconductor layer 11 may be n-AlGaInP doped with n-type Si. A length of the first semiconductor layer 11 may have a range of 1.5 μm to 5 μm, but is not limited thereto.

The second semiconductor layer 13 may be a p-type semiconductor layer, and when the light emitting element LD emits red light, the second semiconductor layer 13 may include a semiconductor material having a chemical formula of $In_xAl_yGa_{1-x-y}P$ ($0 \le x \le 1$, $0 \le y \le 1$, $0 \le x+y \le 1$). For example, the second semiconductor layer 13 may be at least one of p-type doped InAlGaP, GaP, AlGaNP, InGaP, AlP, and InP. The second semiconductor layer 13 may be doped with a p-type dopant, and for example, the p-type dopant may be Mg, Zn, Ca, Se, Ba, or the like. In one or more example embodiments, the second semiconductor layer 13 may be p-GaP doped with p-type Mg. A length of the second semiconductor layer 13 may have a range of 0.08 μm to 0.25 μm, but is not limited thereto.

The active layer 12 may be located between the first semiconductor layer 11 and the second semiconductor layer 13. Like the active layer 12 of FIGS. 1A and 1B, the active layer 12 of FIGS. 2A and 2B can also emit light of a specific wavelength because the active layer 12 includes materials of a single or multiple quantum well structure. For example, when the active layer 12 emits light in a red wavelength band, the active layer 12 may include materials such as AlGaP, InAlGaP, and the like. For example, when the active layer 12 is a multiple-quantum well structure and a structure in which a quantum layer and a well layer are alternately stacked, the quantum layer may include a material such as AlGaP or InAlGaP, and the well layer may include a material such as GaP or AlInP. In one or more example embodiments, the active layer 12 may emit red light having a central wavelength band of 620 nm to 750 nm, including InAlGaP as the quantum layer and InAlP as the well layer.

The light emitting element LD of FIGS. 2A and 2B may include a clad layer located adjacent to the active layer 12. As shown in the drawing, the third semiconductor layer 17 and the fourth semiconductor layer 18 respectively located between the first semiconductor layer 11 and the second semiconductor layer 13 up and down the active layer 12 are may be a clad layer.

The third semiconductor layer 17 may be located between the first semiconductor layer 11 and the active layer 12. The third semiconductor layer 17 may be an n-type semiconductor like the first semiconductor layer 11, and for example, the third semiconductor layer 17 may include a semiconductor material having a chemical formula of $In_xAl_yGa_{1-x-y}P$ ($0 \le x \le 1$, $0 \le y \le 1$, $0 \le x+y \le 1$). In one or more example embodiments, the first semiconductor layer 11 may be n-InAlGaP, and the third semiconductor layer 17 may be n-InAlP. However, the embodiment is not limited thereto.

The fourth semiconductor layer 18 may be located between the active layer 12 and the second semiconductor layer 13. The fourth semiconductor layer 18 may be an n-type semiconductor like the second semiconductor layer 13, and for example, the fourth semiconductor layer 18 may include a semiconductor material having a chemical formula of $In_xAl_yGa_{1-x-y}P$ ($0 \le x \le 1$, $0 \le y \le 1$, $0 \le x+y \le 1$). In one or more example embodiments, the second semiconductor layer 13 may be p-GaP, and the fourth semiconductor layer 18 may be p-InAlP.

The fifth semiconductor layer 19 may be located between the fourth semiconductor layer 18 and the second semiconductor layer 13. The fifth semiconductor layer 19 may be a p-type doped semiconductor, such as the second semiconductor layer 13 and the fourth semiconductor layer 18. In some embodiments, the fifth semiconductor layer 19 may function to reduce a difference in lattice constant between the fourth semiconductor layer 18 and the second semiconductor layer 13. For example, the fifth semiconductor layer 19 may be a tensile strain barrier reducing (TSBR) layer. For example, the fifth semiconductor layer 19 may include at least one of p-InGaP, p-InAlP, and p-InAlGaP, but is not limited thereto. In one or more example embodiments, the lengths of the third semiconductor layer 17, the fourth semiconductor layer 18, and the fifth semiconductor layer 19 may have a range of 0.08 μm to 0.25 μm, but are not limited thereto.

The light emitting element LD described above may be used as a light emitting source for various display devices. The light emitting element LD may be manufactured through a surface treatment process. For example, when a plurality of light emitting elements LD is mixed with a fluid solution (or solvent) and supplied to each light emitting area (e.g., light emitting area of each pixel or light emitting area of each sub-pixel), each light emitting element LD may be surface-treated so that the light emitting elements LD may be uniformly sprayed without non-uniform agglomeration in the solution.

A light emitting device including the light emitting element LD may be used in various types of devices that require a light source, including a display device. For example, when disposing a plurality of light emitting elements LD in the light emitting area of each pixel of the display panel, the light emitting elements LD may be used as the light source of each pixel. However, a field of application of the light emitting element LD is not limited to one or more example embodiments described above. For example, the light emitting element LD may be also used in other types of devices that require a light source, such as a lighting device.

Next, Referring to FIGS. 3A and 3B, a light emitting element LD' manufactured by a growth method will be described.

In the description of the light emitting element LD' manufactured by the growth method, a description will be made focusing on the differences from one or more example embodiments described above, portions not specifically described in the light emitting element LD' manufactured by the growth method are in accordance with the example embodiments described above.

Referring to FIGS. 3A and 3B, the light emitting element LD' according to one or more example embodiments of the present disclosure may include a first semiconductor layer 11', a second semiconductor layer 13', and an active layer 12' interposed between the first and second semiconductor layers 11' and 13'. According to one or more example embodiments, the light emitting element LD' may include a light emitting pattern 10 of a core-shell structure having the first semiconductor layer 11' located at the center, the active layer 12' covering at least one side of the first semiconductor layer 11' (e.g., the active layer 12' may surround the first semiconductor layer 11' around the periphery of the first semiconductor layer 11'), and the second semiconductor layer 13' covering at least one side of the active layer 12' (e.g., the second semiconductor layer 13' may surround the active layer 12' around the periphery of the active layer 12'), and an added electrode 15' covering at least one side of the second semiconductor layer 13' (e.g., the added electrode 15' may surround the second semiconductor layer 13' around the periphery of the second semiconductor layer 13').

The light emitting element LD' may be provided in a polygonal horn shape extending in one direction. For example, the light emitting element LD' may be provided in a hexagonal horn shape. When the extending direction of the light emitting element LD' is referred to as a length direction L', the light emitting element LD' may have one end (or lower end) and the other end (or upper end) in the length direction L'. At one end (or lower end) of the light emitting element LD', a portion of one of the first and second semiconductor layers 11' and 13' may be exposed, and at the other end (or upper end) of the light emitting element LD, a portion of the other one of the first and second semiconductor layers 11' and 13' may be exposed. For example, a portion of the first semiconductor layer 11' may be exposed at one end (or lower end) of the light emitting element LD', and a portion of the second semiconductor layer 13' may be exposed at the other end (or upper end) of the light emitting element LD'. In this case, when the light emitting element LD' is used as a light source of the display device, the exposed portion of the first semiconductor layer 11' may contact one of driving electrodes driving the light emitting element LD' and the exposed portion of the second semiconductor layer 13' may contact the other driving electrode.

According to one or more example embodiments, when the light emitting element LD' includes an added electrode 15', a portion of the added electrode 15' surrounding the at least one side of the second semiconductor layer 13' may be exposed at the other end (or upper end) of the light emitting element LD'. In this case, when the light emitting element LD' is used as a light source of the display device, the exposed portion of the added electrode 15' may contact the other driving electrode to be electrically connected to one electrode.

In one or more example embodiments of the present disclosure, the first semiconductor layer 11' may be located at a core, that is, a center of the light emitting element LD'. The light emitting element LD' may be provided in a shape corresponding to a shape of the first semiconductor layer 11'. For example, when the first semiconductor layer 11' has a hexagonal horn shape, the light emitting element LD' and the light emitting pattern 10' may also have a hexagonal horn shape.

The active layer 12' may be provided and/or formed in a form covering (or partially covering) the outer surface (e.g., the outer peripheral surface or the outer circumferential surface) of the first semiconductor layer 11' in the length direction L' of the light emitting element LD'. For example, the active layer 12' may be provided and/or formed in a form covering an area other than the other end on the lower side of both ends of the first semiconductor layer 11' in the length direction L' of the light emitting element LD'.

The second semiconductor layer 13' may be provided and/or formed in a form surrounding the active layer 12' in the length direction L of the light emitting element LD', and may include a semiconductor layer of a different type from the first semiconductor layer 11'. For example, the second semiconductor layer 13' may be formed of a semiconductor material different from the semiconductor material of the first semiconductor layer 11' or the second semiconductor layer 13' may be formed of a semiconductor material having material properties that are different from material properties of the semiconductor material of the first semiconductor layer 11'. In one or more embodiments, the second semiconductor layer 13' may include at least one p-type semiconductor layer.

In one or more example embodiments of the present disclosure, the light emitting element LD' may include an added electrode 15' covering at least one side of the second semiconductor layer 13'. The added electrode 15' may be an ohmic contact electrode electrically connected to the second semiconductor layer 13' or a Schottky contact electrode, but is not limited thereto.

As described above, the light emitting element LD' may be implemented as a hexagonal horn shape that both ends thereof are protruded, and may be implemented as a light emitting pattern 10 of a core-shell structure including the first semiconductor layer 11' located at the center thereof, the active layer 12' covering the first semiconductor layer 11', and the second semiconductor layer 13' covering the active layer 12', and an added electrode 15' covering the second semiconductor layer 13'. The first semiconductor layer 11' may be located at one end (or lower end) of the light emitting element LD' having a hexagonal horn shape, and the added electrode 15' may be located at the other end (or upper end) of the light emitting element LD'.

In one or more example embodiments, the light emitting element LD' may further include an insulation film 14' provided on an outer surface (e.g., an outer peripheral surface or an outer circumferential surface) of the light emitting pattern 10 having a core-shell structure. The insulation film 14' may include a transparent insulation material.

FIG. 4 shows a display device according to one or more example embodiments of the present disclosure, and is a schematic top plan view of a display device using any one of the light emitting elements shown in FIGS. 1A, 1B, 2A, 2B, 3A, and 3B as a light emitting source.

In FIG. 4, for better understanding and ease of description, the structure of the display device is briefly illustrated based on the display area where the image is displayed. However, according to one or more example embodiments, at least one driver (e.g., scan driver, data driver, etc.) and/or a plurality of signal lines not shown may be further located on the display device.

Referring to FIGS. 1A, 1B, 2A, 2B, 3A, 3B and 4, the display device according to one or more example embodiments of the present disclosure includes a first substrate SUB1, a plurality of pixels PXL provided on the first substrate SUB1, each pixel PXL including at least one light emitting element LD, a driver (not shown) provided on the first substrate SUB1 to drive the pixels PXL, and a line unit (not shown) connecting the pixels PXL and the driver.

The display device may be classified into a display device of a passive matrix type and a display device of an active matrix type according to the method of driving the light emitting element LD. For example, when the display device is implemented in the active matrix type, each of the pixels PXL may include a driving transistor that controls an amount of current supplied to the light emitting element LD and a switching transistor that transfers a data signal to the driving transistor.

In view of resolution, contrast, and operation speed, the display device of the active matrix type, which is selected and turned on and off for each pixel PXL, has become mainstream, but the present disclosure is not limited thereto. The display device of the passive matrix type, which is turned on and off for each group of the pixels PXL, may also use constituent elements (e.g., first and second electrodes) for driving the light emitting element LD.

The first substrate SUB1 may include a display area DA and a non-display area NDA.

According to one or more example embodiments, the display area DA may be located in a central area of the display device, and the non-display area NDA may be located in an edge area (or a peripheral area) of the display device to surround the display area DA. For example, the non-display area NDA may be located adjacent to the display area DA along one or more edges (or around a periphery) of the display area DA. However, positions of the display area DA and the non-display area NDA are not limited thereto, and the positions thereof may be changed.

The display area DA may be an area in which pixels PXL displaying an image are provided. The non-display area NDA may be an area in which a driver for driving the pixels PXL and a portion of the line unit connecting the pixels PXL and the driver are provided.

The display area DA may have various shapes. For example, the display area DA may be provided as a closed polygon including sides consisting of a straight line. In one or more embodiments, the display area DA may be provided as a circular shape and/or elliptical shape including sides consisting of a curved line. In one or more embodiments, the display area DA may be provided in various shapes, such as, a semicircle and a semi-ellipse, including sides consisting of a straight line and a curved line.

The non-display area NDA may be provided on at least one side of the display area DA. In one or more example embodiments of the present disclosure, the non-display area NDA may surround the display area along a periphery (or a circumference or an edge) of the display area DA.

The first substrate SUB1 may include a transparent insulation material and may transmit light. The first substrate SUB1 may be a rigid substrate or a flexible substrate.

Each of the pixels PXL may be provided in the display area DA on the first substrate SUB1. Each of the pixels PXL may be a minimum unit for displaying an image and may be provided in a plurality.

The pixels PXL may include a plurality of sub-pixels S-PXL1, S-PXL2, and S-PXL3. For example, as shown in FIG. 4, one pixel PXL may include first to third sub-pixels S-PXL1, S-PXL2, and S-PXL3. In some embodiments, the first sub-pixel S-PXL1 may emit red light, the second sub-pixel S-PXL2 may emit green light, and the third sub-pixel S-PXL3 may emit blue light. However, the color, type, and/or number of the first to third sub-pixels S-PXL1, S-PXL2, and S-PXL3 constituting each pixel PXL are not particularly limited, and the color of light emitted by each of the first to third sub-pixels S-PXL1, S-PXL2, and S-PXL3 may be variously changed. FIG. 4 shows an example embodiment in which the pixels PXL are arranged in a stripe form (e.g., matrix form) in the display area DA, but the present disclosure is not limited thereto. For example, the display area DA may have various pixel arrangement types, including a pentile arrangement structure.

According to one or more example embodiments, each of the first to third sub-pixels S-PXL1, S-PXL2, and S-PXL3 may include at least one light emitting element LD driven by a corresponding scan signal and a data signal. The light emitting element LD may have a size as small as a micro-scale or a nano-scale, and may be connected to the light emitting elements located adjacent to each other in parallel, but the present disclosure is not limited thereto.

The light emitting element LD may constitute light sources of the first to third sub-pixels S-PXL1, S-PXL2, and S-PXL3. The light emitting element LD may emit white light and/or color light. For example, the light emitting element LD may emit blue light. In this case, the blue light may be converted into any one of red, green, blue, and white colors and emitted by the light conversion pattern QDP located on the light emitting elements LD described below. However, the color of light converted by the light conversion pattern QDP is not limited thereto. For example, the first to third sub-pixels S-PXL1, S-PXL2, and S-PXL3 may emit one of cyan, magenta, yellow, and white.

The driver may provide a suitable signal (e.g., a set signal or a predetermined signal) and a suitable power (e.g., a set power or a predetermined power) to each of the first to third sub-pixels S-PXL1, S-PXL2, and S-PXL3 through the line unit, and accordingly can control a driving of the first to third sub-pixels S-PXL1, S-PXL2, and S-PXL3. In FIG. 4, the line unit is omitted for better understanding and ease of description.

The driver may include a scan driver providing a scan signal to the first to third sub-pixels S-PXL1, S-PXL2, and S-PXL3 through a scan line, a light emission driver providing a light emission control signal to the first to third sub-pixels S-PXL1, S-PXL2, and S-PXL3 through a light emission control line, a data driver providing a data signal to the first to third sub-pixels S-PXL1, S-PXL2, and S-PXL3 through a data line, and a timing controller. The timing controller may control the scan driver, the light emission driver, and the data driver.

FIGS. 5A-5E are circuit diagrams showing electrical connection relationships of constituent elements included in one sub-pixel shown in FIG. 4 according to various example embodiments. Here, because the structures of the first to third sub-pixels S-PXL1, S-PXL2, and S-PXL3 are substantially equivalent, the embodiment will be described below based on the first sub-pixel S-PXL1.

For example, FIGS. 5A-5E show an electrical connection relationship of constituent elements included in the pixel PXL that may be applied to an active display device according to another example embodiment. However, the types of the constituent elements included in the first sub-pixel S-PXL1 to which one or more example embodiments of the present disclosure may be applied is not limited thereto.

In FIGS. 5A-5E, the area in which the constituent elements are provided as well as the constituent elements included in each of the sub-pixels shown in FIG. 4, are referred to as the first sub-pixel S-PXL1. According to one or more example embodiments, each first sub-pixel S-PXL1 shown in FIGS. 5A-5E may be any one of the first sub-pixels S-PXL1 provided in the display device of FIG. 4, and the first sub-pixels S-PXL1 may have substantially the same or similar structure to each other.

Referring to FIGS. 1A-3B, 4, 5A-5E, one sub-pixel S-PXL may include a light emitting unit EMU that generates light of luminance corresponding to a data signal. In one or more embodiments, the first sub-pixel S-PXL1 may further include a pixel circuit 144 for driving the light emitting unit EMU.

According to one or more example embodiments, the light emitting unit EMU may include a plurality of the light emitting elements LD that are connected in parallel between a first power line PL1 to which a voltage of the first driving power supply VDD is applied and a second power line PL2 to which a voltage of the second driving power supply VSS is applied. For example, the light emitting unit EMU may include a first electrode EL1 (or first alignment electrode) connected to the first driving power supply VDD via the pixel circuit 144 and the first power line PL1, a second electrode EL2 (or second alignment electrode) connected to the second driving power supply VSS through the second power line PL2, and a plurality of light emitting elements LD in parallel connected to each other in the same direction between and the first and second electrodes EL1 and EL2. In one or more example embodiments of the present disclosure, the first electrode EL1 may be an anode, and the second electrode EL2 may be a cathode.

In one or more example embodiments of the present disclosure, each of the light emitting elements LD included in the light emitting unit EMU may include a first end connected to the first driving power supply VDD through the first electrode EL1 and a second end connected to the second driving power supply VSS through the second electrode EL2. The first driving power supply VDD and the second driving power supply VSS may have different potentials from each other. For example, the first driving power supply VDD may be set as a high potential power supply, and the second driving power supply VSS may be set as a low potential power supply. At this time, a potential difference between the first and second driving power supplies VDD and VSS may be set to a threshold voltage or higher of the light emitting elements LD during the light emitting period of the first sub-pixel S-PXL1.

As described above, each light emitting element LD in parallel connected to each other in the same direction (e.g., forward direction) between the first electrode EL1 and the second electrode EL2 to which voltages of different potentials are supplied may constitute each effective light source. These effective light sources may be gathered to constitute the light emitting unit EMU of the first sub-pixel S-PXL1.

The light emitting elements LD of the light emitting unit EMU may emit light with luminance corresponding to a driving current supplied through a corresponding pixel circuit 144. For example, during each frame period, the pixel circuit 144 may supply a driving current corresponding to a grayscale value of corresponding frame data to the light emitting unit EMU. The driving current supplied to the light emitting unit EMU may flow through the light emitting elements LD connected in the same direction (e.g., in parallel connection with each other). Accordingly, while each light emitting element LD emits light with luminance corresponding to the current flowing therein, the light emitting unit EMU may emit light of luminance corresponding to the driving current.

Figure 5A:
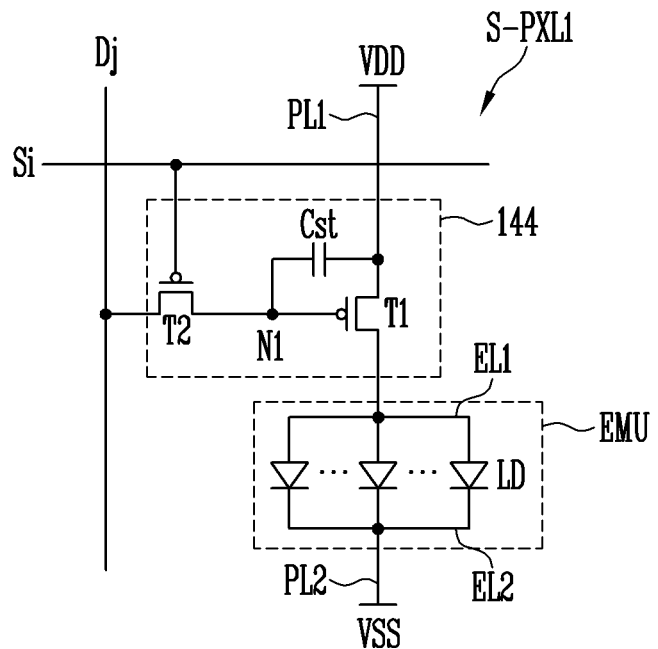
FIGS. 5A-5E are circuit diagrams showing electrical connection relationships of constituent elements included in one sub-pixel shown in FIG. 4 according to one or more example embodiments of the present disclosure.
Figure 5B:
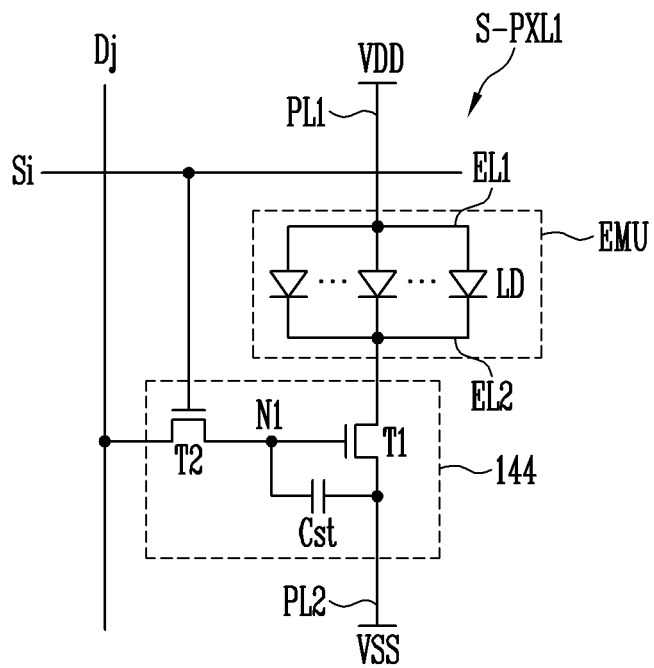
Figure 5C:
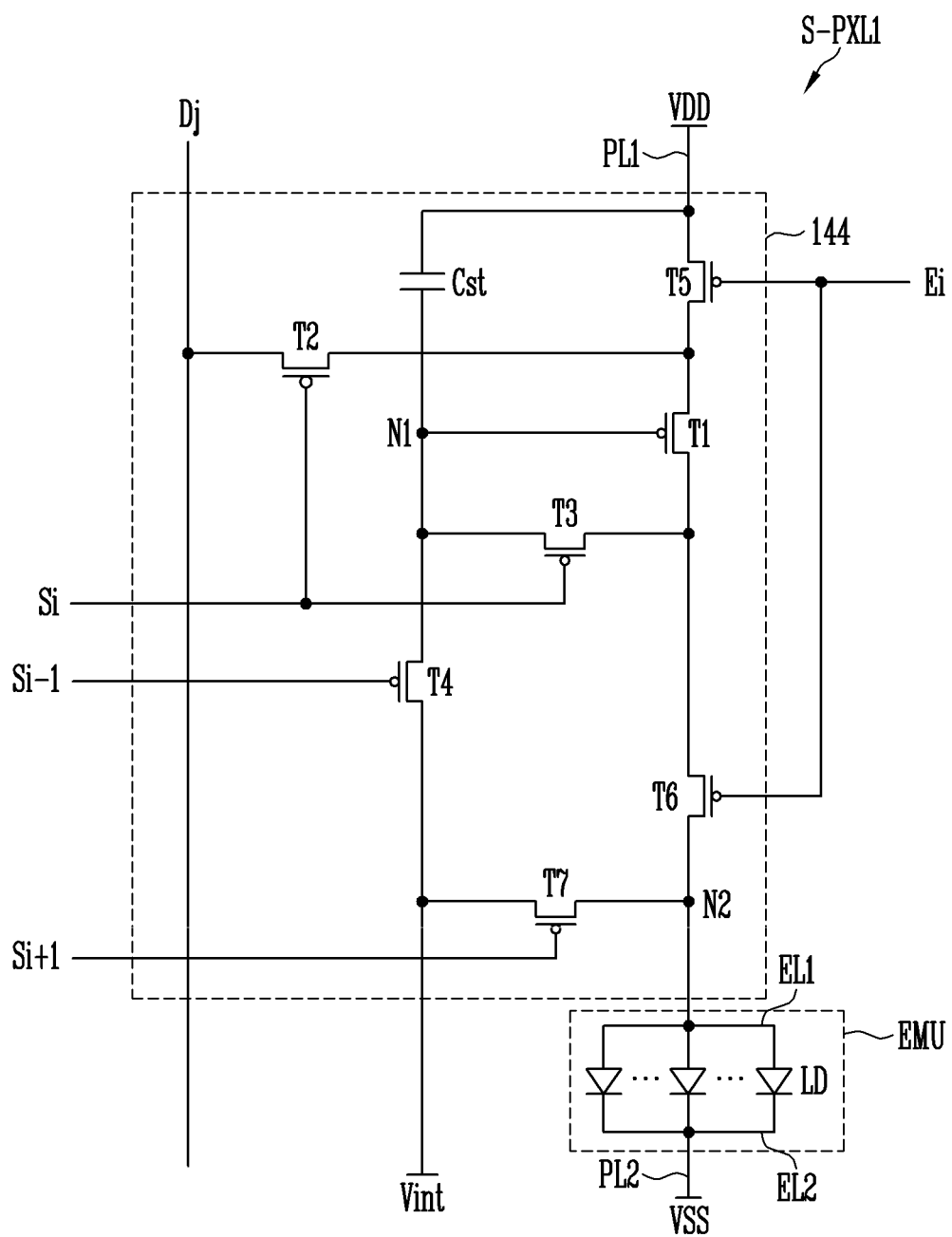
Figure 5D:
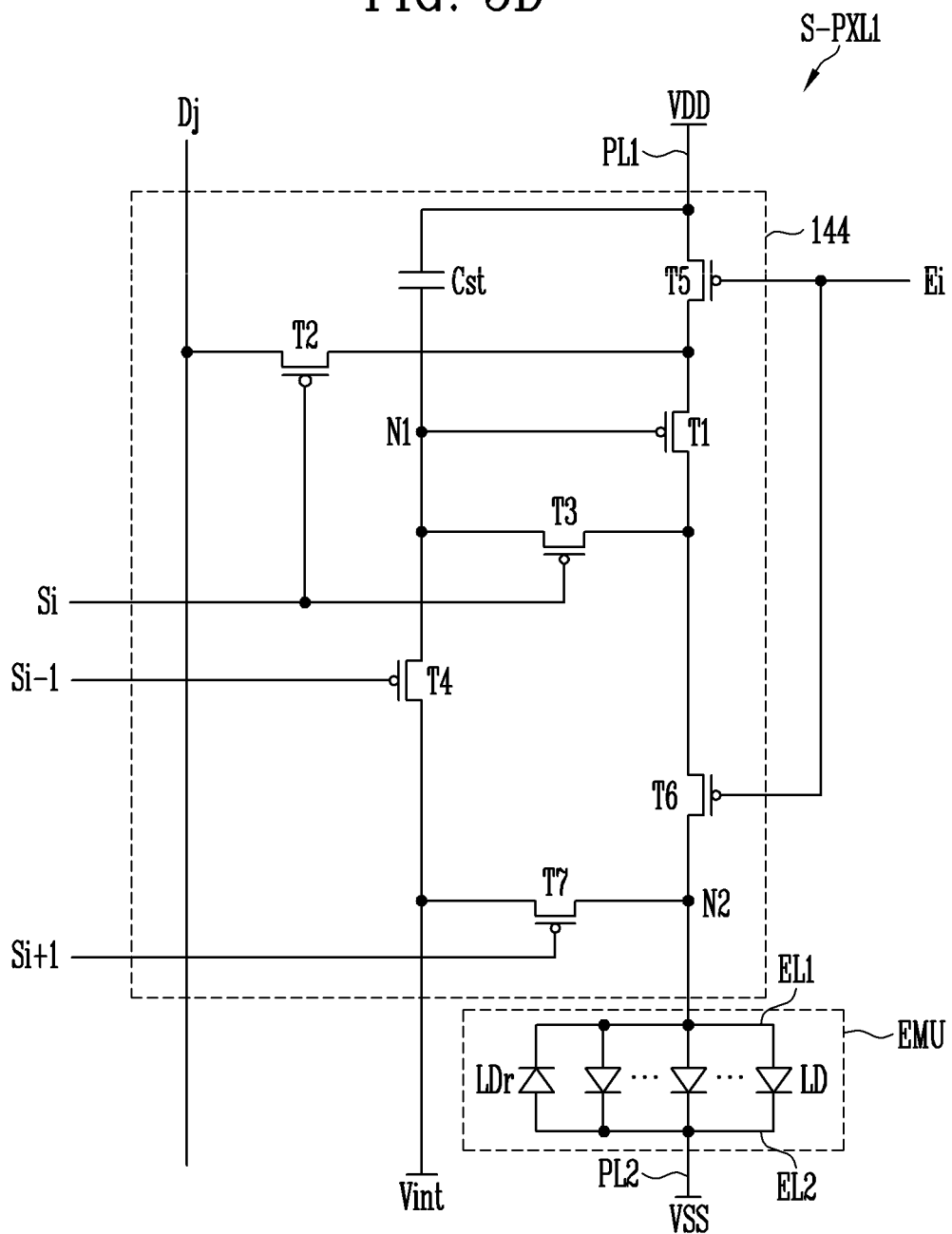
Figure 5E:
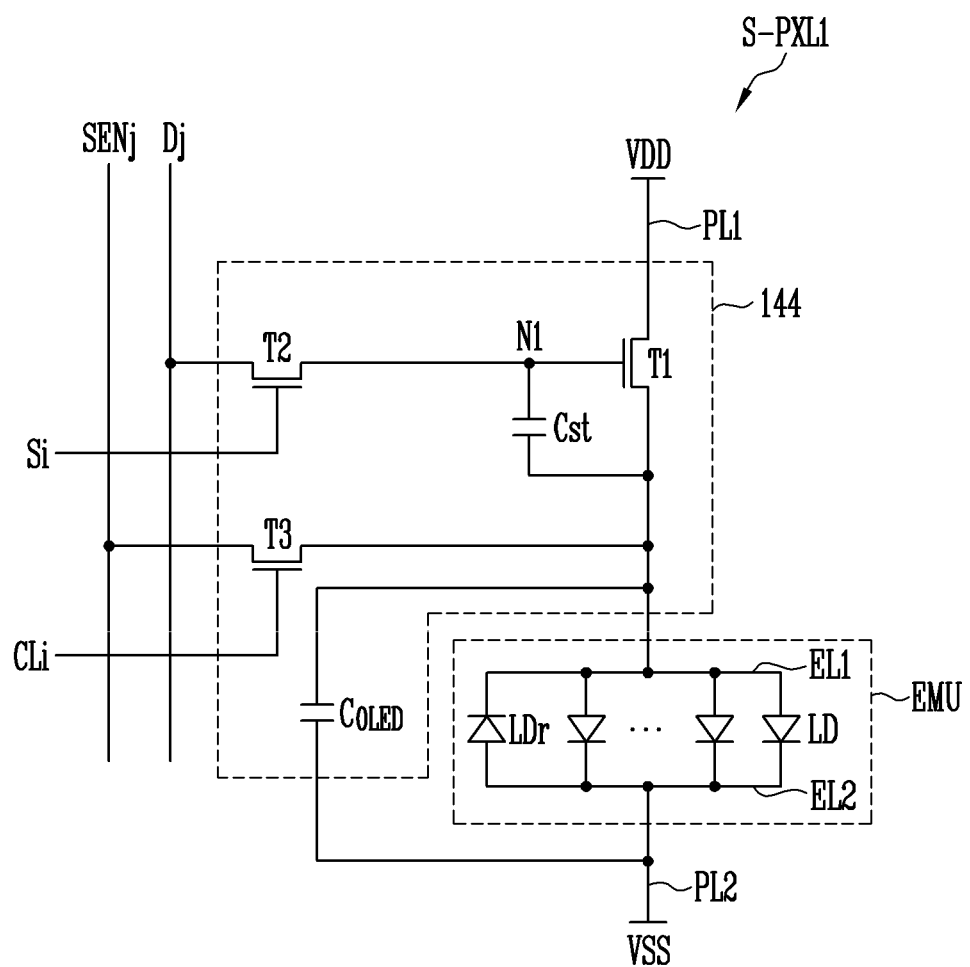

In FIGS. 5A-5E, an example embodiment in which the light emitting elements LD are connected to each other in the same direction (e.g., in parallel connection with each other) between first and second driving power supplies VDD and VSS is shown, but the present disclosure is not limited thereto. According to one or more example embodiments, the light emitting unit EMU may further include at least one ineffective light source in addition to the light emitting elements LD constituting each effective light source. For example, as shown in FIGS. 5D and 5E, a reverse direction light emitting element LDr may be further connected between the first and second electrodes EL1 and EL2 of the light emitting unit EMU. The reverse direction light emitting element LDr may be connected in parallel between the first and second electrodes EL1 and EL2 together with the light emitting elements LD constituting the effective light sources (e.g., the light emitting elements connected in the forward direction), but may be connected between the first and second electrodes EL1 and EL2 in the opposite direction to the light emitting elements LD (e.g., opposite to the forward direction). The reverse direction light emitting element LDr may maintain an inactive state (e.g., a reversed biased state) even when a suitable driving voltage (e.g., a set driving voltage or a predetermined driving voltage, e.g., driving voltage of forward direction) is applied between the first and second electrodes EL1 and EL2, so that substantially no current flows through the reverse direction light emitting element LDr.

The pixel circuit 144 may be connected to the scan line Si and data line Dj of the corresponding first sub-pixel S-PXL1. For example, when the first sub-pixel S-PXL1 is located in the i-th row (i.e., i is natural number) and the j-th column (i.e., j is natural number) of the display area DA, the pixel circuit 144 of the first sub-pixel S-PXL1 may be connected to the i-th scan line Si and j-th data line Dj of the display area DA. According to one or more example embodiments, as shown in FIGS. 5A and 5B, the pixel circuit 144 may include the first and second transistors T1 and T2 and the storage capacitor Cst. However, the structure of the pixel circuit 144 is not limited to the example embodiments shown in FIGS. 5A and 5B.

First, referring to FIG. 5A, the pixel circuit 144 may include the first and second transistors T1 and T2 and the storage capacitor Cst.

A first terminal of the second transistor T2 (e.g., a switching transistor) may be connected to the data line Dj, and a second terminal of the second transistor T2 may be connected to the first node N1. Here, the first terminal and the second terminal of the second transistor T2 may be different terminals. For example, when the first terminal is a source electrode, the second terminal may be a drain electrode or vice versa. The gate electrode of the second transistor T2 may be connected to the scan line Si.

The second transistor T2 may be turned on when a scan signal of a voltage (e.g., a low voltage) at which the second transistor T2 may be turned on is supplied from the scan line Si to the gate electrode of the second transistor T2 to electrically connecting the data line Dj and the first node N1. At this time, a data signal of the corresponding frame is supplied to the data line Dj, and accordingly, the data signal is transferred to the first node N1. The data signal transferred to the first node N1 is charged to the storage capacitor Cst.

The first terminal of the first transistor T1 (or a driving transistor) may be connected to the first driving power supply VDD, and the second terminal of the first transistor T1 may be electrically connected to the first electrode EL1 of each of the light emitting elements LD. For example, the second terminal of the first transistor T1 may be electrically connected to the first electrode EL1 of the light emitting unit EMU. In one or more embodiments, the gate electrode of the first transistor T1 may be connected to the first node N1. The first transistor T1 controls an amount of a driving current supplied to the light emitting elements LD in response to the voltage of the first node N1. For example, the first transistor T1 may control an amount of the driving current supplied to each of the light emitting elements LD of the light emitting unit EMU.

One electrode of the storage capacitor Cst may be connected to the first driving power supply VDD, and the other electrode of the storage capacitor Cst may be connected to the first node N1. The storage capacitor Cst may be charged according to the voltage corresponding to the data signal supplied to the first node N1, and may maintain the charged voltage until the data signal of the next frame is supplied.

Each of FIGS. 5A and 5B shows the pixel circuit 144 including the second transistor T2 for transferring the data signal into the first sub-pixel S-PXL1, the storage capacitor Cst for storing the data signal, and the first transistor T1 for supplying the driving current corresponding to the data signal to the light emitting elements LD of the light emitting unit EMU.

However, the present disclosure is not limited thereto, and the structure of the pixel circuit 144 may be variously changed. For example, the pixel circuit 144 may further include at least one transistor element such as a transistor element for compensating for the threshold voltage of the first transistor T1, a transistor element for initializing the first node N1, and/or a transistor element for controlling the light emitting time of the light emitting element LD, and the like, or other circuit elements such as a boosting capacitor for boosting a voltage of the first node N1, and the like.

In one or more example embodiments, in FIG. 5A, transistors included in the pixel circuit 144, for example first and second transistors T1 and T2 are all shown to p-type transistors, but the present disclosure is not limited thereto. For example, at least one of the first and second transistors T1 and T2 included in the pixel circuit 144 may be changed to an n-type transistor.

Next, referring to FIGS. 1A-3B, 4, and 5B, the first and second transistors T1 and T2 according to one or more example embodiments of the present disclosure may be implemented as an n-type transistor. The pixel circuit 144 shown in FIG. 5B may has the configuration or operation similar to the pixel circuit 144 of FIG. 5A except for changing a connection position of some constituent elements (e.g., the storage capacitor Cst is connected between the first node N1 and the second electrode of the first transistor T1) due to a change in transistor type. Therefore, the description thereof will be briefly performed.

In one or more example embodiments of the present disclosure, the pixel circuit 144 shown in FIG. 5B may include the first and second transistors T1 and T2 which may be n-type transistors, and the storage capacitor Cst. When the first and second transistors T1 and T2 are n-type transistors, the light emitting unit EMU may be connected between the first driving power supply VDD and the pixel circuit 144 to stabilize the storage capacitor Cst that charges the voltage corresponding to the data signal supplied to the first node N1. However, the present disclosure is not limited thereto, and according to one or more example embodiments, the light emitting unit EMU shown in FIG. 5B may be connected between the pixel circuit 144 and the second driving power supply VSS. In one or more example embodiments of the present disclosure, the configuration of the pixel circuit 144 is not limited to an example embodiment shown in FIGS. 5A and 5B. For example, the pixel circuit 144 may be configured as an example embodiment shown in FIGS. 5C and 5D.

The pixel circuit 144, as shown in FIGS. 5C and 5D, may be connected to the scan line Si and the data line Dj of the first sub-pixel S-PXL1. For example, when the first sub-pixel S-PXL1 is located in the i-th row and j-th column of the display area DA, the pixel circuit 144 of the first sub-pixel S-PXL1 may be connected to the i-th scan line Si and j-th data line Dj of the display area DA.

Further, according to one or more example embodiments, the pixel circuit 144 may be further connected to at least one other scan line. For example, the first sub-pixel S-PXL1 located on the i-th row of the display area DA may be further connected to the i−1-th scan line Si−1 (e.g., a previous scan line) and/or the i+1-th scan line Si+1 (e.g., a next scan line). According to one or more example embodiments, the pixel circuit 144 may be further connected to a third power supply in addition to the first and second driving power supplies VDD and VSS. For example, the pixel circuit 144 may be connected to an initialization power supply Vint.

The pixel circuit 144 may include first to seventh transistors T1 to T7 and the storage capacitor Cst.

One electrode of the first transistor T1 (or a driving transistor), for example, the source electrode may be connected to the first driving power supply VDD via the fifth transistor T5, and another electrode of the first transistor T1, for example, the drain electrode may be connected to one end of the light emitting element LD via the sixth transistor T6. For example, the drain electrode of the first transistor T1 may be electrically connected to the first electrode EL1 of each of the light emitting elements LD. Further, the gate electrode of the first transistor T1 may be connected to the first node N1. The first transistor T1 controls the driving current flowing between the first driving power supply VDD and the second driving power supply VSS via light emitting elements LD in response to the voltage of the first node N1.

The second transistor T2 (or the switching transistor) may be connected between the j-th data line Dj connected to the first sub-pixel S-PXL1 and the source electrode of the first transistor T1. Further, the gate electrode of the second transistor T2 may be connected to the i-th scan line Si connected to the first sub-pixel S-PXL1. The second transistor T2 may be turned on when a scan signal of a gate-on voltage (e.g., low voltage) is supplied from the i-th scan line Si to electrically connect the j-th data line Dj to the source electrode of the first transistor T1. Therefore, when the second transistor T2 is turned on, the data signal supplied from the j-th data line Dj is transferred to the source electrode of the first transistor T1.

The third transistor T3 may be connected between the drain electrode of the first transistor T1 and the first node N1. Further, the gate electrode of the third transistor T3 may be connected to the i-th scan line Si. The third transistor T3 may be turned on when a scan signal of a gate-on voltage is supplied from the i-th scan line Si to electrically connect the drain electrode of the first transistor T1 and the first node N1.

The fourth transistor T4 may be connected between the first node N1 and an initialization power line to which the initialization power supply Vint is applied. Further, the gate electrode of the fourth transistor T4 may be connected to the previous scan line, for example, the i−1-th scan line Si−1. The fourth transistor T4 may be turned on when a scan signal of the gate-on voltage (e.g., a low level voltage) is supplied from the i−1-th scan line Si−1 to transfer the voltage of the initialization power supply Vint to the first node N1. Here, the initialization power supply Vint may have a voltage less than or equal to the lowest voltage of the data signal.

The fifth transistor T5 may be connected between the first driving power supply VDD and the first transistor T1 (e.g., the source electrode of the first transistor T1). Further, the gate electrode of the fifth transistor T5 may be connected to a corresponding light emission control line, for example, the i-th light emission control line Ei. The fifth transistor T5 may be turned off when a light emission control signal of a gate-off voltage (e.g., a high level voltage) is supplied from the i-th light emission control line Ei, and may be turned on in other cases (e.g., when an emission control signal having a gate-on voltage (e.g., a low level voltage) is supplied to the ith emission control line Ei).

The sixth transistor T6 may be connected between the first transistor T1 and one end of the light emitting elements LD. For example, the sixth transistor T6 may be connected between the drain electrode of the first transistor and the first electrode EL1 of each of the light emitting elements LD of the light emitting element EMU or the second node N2. Further, the gate electrode of the sixth transistor T6 may be connected to the i-th light emission control line Ei. The sixth transistor T6 may be turned off when a light emission control signal of a gate-off voltage (e.g., a high level voltage) is supplied from the i-th light emission control line Ei, and may be turned on in other cases (e.g., when an emission control signal having a gate-on voltage (e.g., a low level voltage) is supplied to the ith emission control line Ei).

The seventh transistor T7 may be connected between one end of the light emitting elements LD (e.g., the first electrode EL1 of each of the light emitting elements LD of the light emitting element EMU) or the second node N2 and the initializing power line. Further, the gate electrode of the seventh transistor T7 may be connected to one of the scan lines in the next stage, for example, the i+1-th scan line Si+1. The seventh transistor T7 may be turned on when a scan signal of the gate-on voltage (e.g., a low level voltage) is supplied from the i+1-th scan line Si+1, and may supply the voltage of the initialization power supply Vint to one end of the light emitting elements LD (e.g., the first electrode EL1 of each of the light emitting elements LD of the light emitting element EMU).

The storage capacitor Cst may be connected between the first driving power supply VDD and the first node N1. The storage capacitor Cst may store a data signal supplied to the first node N1 during each frame period and a voltage corresponding to the threshold voltage of the first transistor T1.

In FIGS. 5C and 5D, transistors included in the pixel circuit 144, for example, first to seventh transistors T1 to T7 are all shown to as p-type transistors, but the present disclosure is not limited thereto. For example, at least one of the first to seventh transistors T1 to T7 may be changed to an n-type transistor. In one or more embodiments, as shown in FIG. 5D, at least one reverse light emitting element LDr may be further connected between the first electrode EL1 and the second electrode EL2 of the light emitting unit EMU.

In one or more example embodiment of the present disclosure, the configuration of the pixel circuit 144 is not limited to the example embodiments shown in FIGS. 5A-5D. For example, the pixel circuit 144 may be configured as an example embodiment shown in FIG. 5E.

The pixel circuit 144, as shown in FIG. 5E, may be further connected to a control line CLi and a sensing line SENj. For example, the pixel circuit 144 of the first sub-pixel S-PXL1 located in the i-th row and j-th column of the display area DA may be connected to the i-th control line CLi and j-th sensing line SENj of the display area DA. The pixel circuit 144 described above may further include a third transistor T3 in addition to the first and second transistors T1 and T2 shown in FIGS. 5A and 5B.

The third transistor T3 may be connected between the first transistor T1 and the sensing line SENj. For example, one electrode of the third transistor T3 may be connected to one terminal (e.g., source electrode) of the first transistor T1 connected to the first electrode EL1 of the light emitting unit EMU, and another electrode of the third transistor T3 may be connected to the sensing line SENj. On the other hand, when the sensing line SENj is omitted, the another electrode of the third transistor T3 may be connected to the data line Dj.

According to one or more example embodiments, the gate electrode of the third transistor T3 may be connected to the control line CLi. On the other hand, when the control line CLi is omitted, the gate electrode of the third transistor T3 may be connected to the scan line Si. The third transistor T3 may be turned on by a control signal of a gate-on voltage (e.g., a high level voltage) supplied from the control line CLi during a sensing period (e.g., a set sensing period or a predetermined sensing period) to electrically connect the sensing line SENj and the first transistor T1. In one or more embodiments, as shown in FIG. 5E, the storage capacitor Cst may be connected between the first node N1 and the source electrode of the first transistor T1).

According to one or more example embodiments, the sensing period may be a period for extracting characteristic information (e.g., a threshold voltage of first transistor T1) of each of the first sub-pixel S-PXL1 located on the display area DA. During the sensing period described above, the first transistor T1 may be turned on by supplying a reference voltage (e.g., a set reference voltage or a predetermined reference voltage), at which the first transistor T1 may be turned on, to the first node N1, through the data line Dj and the second transistor T2, or by connecting each first sub-pixel S-PXL1 to a current source, and the like. In one or more example embodiments, the first transistor T1 may be connected to the sensing line SENj by supplying a control signal of a gate-on voltage being supplied from the control line CLi at the gate electrode of the third transistor T3 to turn on the third transistor T3. Accordingly, the characteristic information of each first sub-pixel S-PXL1 including the threshold voltage of the first transistor T1 may be extracted through the sensing line SENj described above. The extracted characteristic information may be used to convert image data so that a characteristic deviation between the pixels PXL may be compensated.

In FIG. 5E, example embodiments in which the first to third transistors T1 to T3 are all n-type transistors are shown, but the present disclosure is not limited thereto. For example, at least one of the first to third transistors T1 to T3 described above may be changed to a p-type transistor. In FIG. 5E, an example embodiment in which the light emitting unit EMU is connected between the pixel circuit 144 and the second driving power supply VSS is disclosed, but the light emitting unit EMU may be connected between the first driving power supply VDD and the pixel circuit 144. In one or more embodiments, as shown in FIG. 5E, at least one reverse light emitting element LDr may be further connected between the first electrode EL1 and the second electrode EL2 of the light emitting unit EMU.

In one or more embodiments, In FIGS. 5A-5E, the example embodiments in which the light emitting elements LD constituting each light emitting unit EMU are all connected in parallel are shown, but the present disclosure is not limited thereto. According to an example embodiment, the light emitting unit EMU may be configured to include at least one serial set including a plurality of light emitting elements LD connected in parallel to each other. For example, the light emitting unit EMU may be configured as in series/in parallel mixed structure. The embodiment described above will be described later with reference to FIGS. 7A and 7B.

The structure of the first sub-pixel S-PXL1 that may be applied to the present disclosure is not limited to the example embodiments shown in FIGS. 5A-5E, and the corresponding pixel may have various structures. In one or more embodiments of the present disclosure, each first sub-pixel S-PXL1 may be formed inside a passive light emitting display device. In this case, the pixel circuit 144 may be omitted, and both ends of the light emitting elements LD included in the light emitting unit EMU may be directly connected to scan lines Si−1, Si, and Si+1, a data line Dj, a first power line PL1 to which the first driving power supply VDD is applied, a second power line PL2 to which the second driving power supply VSS is applied, and/or a control line CLi (e.g., a set or a predetermined control line CLi).

Figure 6A:
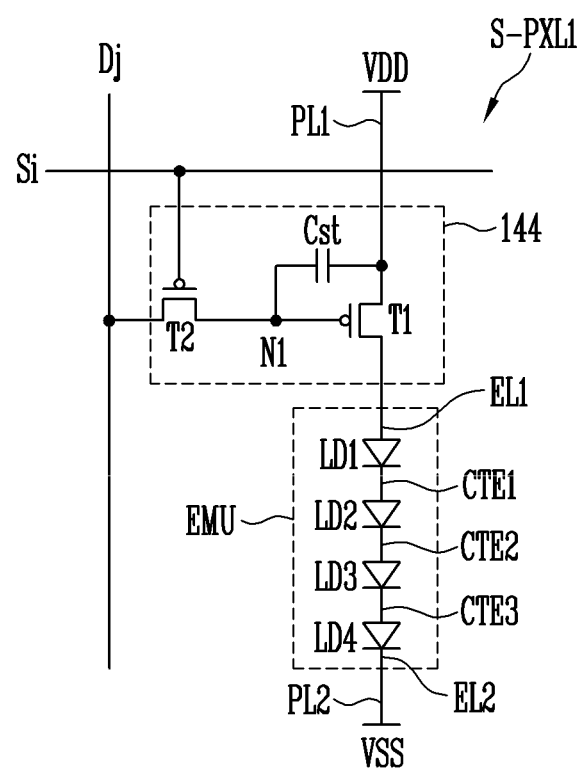
FIGS. 6A and 6B are circuit diagrams showing electrical connection relations of constituent elements included in one sub-pixel shown in FIG. 4 according to another example embodiment of the present disclosure.
Figure 6B:
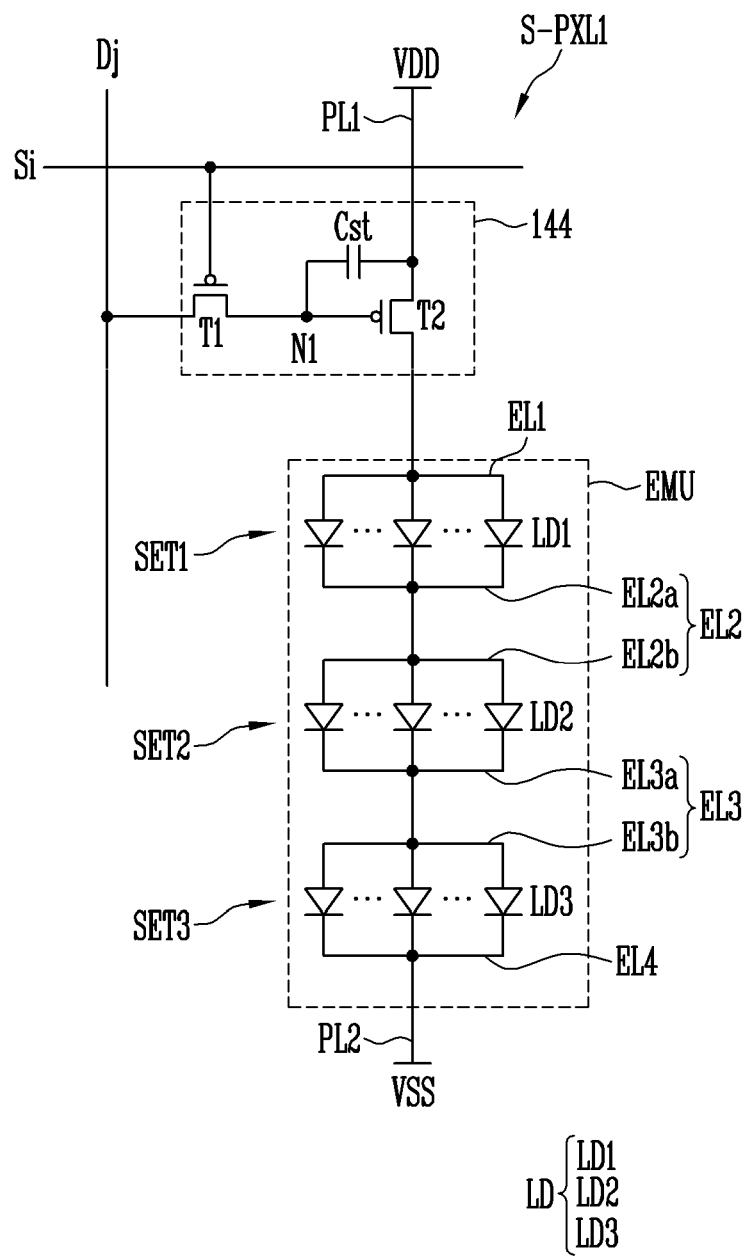

FIGS. 6A and 6B are circuit diagrams showing electrical connection relations of constituent elements included in one sub-pixel shown in FIG. 4 according to another example embodiment. In FIGS. 6A and 6B, the light emitting unit EMU of each first sub-pixel S-PXL1 may be configured to include a plurality of serial sets connected to each other continuously. In order to avoid duplicate descriptions in describing example embodiments of FIGS. 6A and 6B, the configuration similar to or the same as the example embodiments of FIGS. 5A-5E, for example, detailed descriptions of the pixel circuit 144 may not be repeated to avoid redundancy.

First, referring to FIG. 6A, the light emitting unit EMU may include a plurality of light emitting elements connected in series with each other. For example, the light emitting unit EMU may include a first light emitting element LD1, a second light emitting element LD2, a third light emitting element LD3, and a fourth light emitting element LD4 which are serially connected in a forward direction between the first driving power supply VDD and the second driving power supply VSS to constitute an effective light source. In the following example embodiment, at least one light emitting element from among the first to fourth light emitting elements LD1 to LD4 is arbitrarily referred to as a light emitting element LD or light emitting elements LD, or the first to fourth light emitting elements LD1 to LD4 are generally referred to as a light emitting element LD or light emitting elements LD.

One end (e.g., second semiconductor layer) of the first light emitting element LD1 may be connected to the first driving power supply VDD through the first electrode EL1 of the light emitting unit EMU, and the other end (e.g., first semiconductor layer) of the first light emitting element LD1 may be connected to one end (e.g., second semiconductor layer) of the second light emitting element LD2 through a first middle electrode CTE1 that is connected between first and second serial sets.

One end of the second light emitting element LD2 may be connected to the first middle electrode CTE1, and the other end (e.g., first semiconductor layer) thereof may be connected to one end (e.g., second semiconductor layer) of the third light emitting element LD3 through the second middle electrode CTE2 connected between second and third serial sets.

One end of the third light emitting element LD3 may be connected to the second middle electrode CTE2, and the other end (e.g., first semiconductor layer) thereof may be connected to one end (e.g., second semiconductor layer) of the fourth light emitting element LD4 through the third middle electrode CTE3 connected between third and fourth serial sets.

One end of the fourth light emitting element LD4 may be connected to the third middle electrode CTE3, and the other end (e.g., first semiconductor layer) thereof may be connected to the second driving power supply VSS through the second electrode EL2 of the light emitting unit EMU.

As described above, the first to fourth light emitting elements LD1 to LD4 may be connected in series between the first and second electrodes EL1 and EL2 of the light emitting unit EMU of the first sub-pixel S-PXL1.

A voltage applied between the first and second electrodes EL1 and EL2 may be increased and an amount of a driving current flowing through the light emitting unit EMU may be reduced in the light emitting unit EMU having a structure in which light emitting elements LD are connected in series, compared to the light emitting unit EMU having a structure in which light emitting elements LD are connected in parallel. Accordingly, when the light emitting unit EMU of each first sub-pixel S-PXL1 is configured as a serial structure, power consumption of the display device may be reduced.

According to one or more example embodiments, at least one serial set may be provided in a form including a plurality of light emitting elements LD connected in parallel with each other. In this case, the light emitting unit EMU of each first sub-pixel S-PXL1 may be configured as in series/in parallel mixed structure. For example, the light emitting unit EMU may be configured as shown in FIG. 6B.

Next, referring to FIG. 6B, the light emitting unit EMU of the first sub-pixel S-PXL1 may include a plurality of serial sets connected sequentially between first and second driving power supplies VDD and VSS. Further, each serial set may include at least one light emitting element LD connected in a forward direction between two electrodes constituting an electrode pair of the corresponding serial set. For example, the light emitting unit EMU may include first to third serial sets SET1 to SET3 sequentially connected to the first and second driving power supplies VDD and VSS. Each of the first to third serial sets SET1 to SET3 may include two electrodes (i.e., EL1 and EL2a, EL2b and EL3a, EL3b and EL4) constituting the electrode pair of the corresponding serial set, and a plurality of light emitting elements LD that are connected in parallel in a forward direction, for example, in the same direction between two electrodes (i.e., EL1 and EL2a, EL2b and EL3a, EL3b and EL4).

The first serial set SET1 may include the first electrode EL1 and the 2a-th electrode EL2a from among the two electrodes (i.e., EL1 and EL2a, EL2b and EL3a, EL3b and EL4) constituting the electrode pair included in the light emitting unit EMU, and may include at least one first light emitting element LD1 connected between the first electrode EL1 and the 2a-th electrode EL2a. For example, the first serial set SET1 may include the first electrode EL1 connected to the first driving power supply VDD via the pixel circuit 144, the 2a-th electrode EL2a connected to the second driving power supply VSS (e.g., via the second serial stage SET2 and the third serial stage SET3), and a plurality of first light emitting elements LD1 connected between the first electrode EL1 and the 2a-th electrode EL2a. One end (e.g., second semiconductor layer) of each first light emitting elements LD1 may be electrically connected to the first electrode EL1 of the first serial set SET1, and the other end (e.g., first semiconductor layer) thereof may be electrically connected to the 2a-th electrode EL2a of the first serial set SET1. The first light emitting elements LD1 may be connected in parallel with each other between the first electrode EL1 and the 2a-th electrode EL2a of the first serial set SET1, and may be connected in the same direction (e.g., forward direction) between the first electrode EL1 and the 2a-th electrode EL2a.

According to one or more example embodiments, at least one reverse direction light emitting element LDr (see FIG. 5E) may be further connected in the first serial set SET1. The reverse direction light emitting element LDr may be connected in parallel between the first electrode EL1 and the 2a-th electrode EL2a together with the first light emitting elements LD1 constituting the effective light sources (e.g., the light emitting elements connected in the forward direction), but may be connected between the first electrode EL1 and the 2a-th electrode EL2a in the opposite direction to the first light emitting elements LD1. The reverse direction light emitting element LDr may maintain an inactive state (e.g., reverse biased state) even when a driving voltage (e.g., a set driving voltage or a predetermined driving voltage, e.g., driving voltage of forward direction) is applied between the first and 2a-th electrodes EL1 and EL2a, so that substantially no current flows through the reverse direction light emitting element LDr.

The second serial set SET2 may include the 2b-th electrode EL2b and the 3a-th electrode EL3a from among the two electrodes (i.e., EL1 and EL2a, EL2b and EL3a, EL3b and EL4) constituting the electrode pair included in the light emitting unit EMU, and may include at least one second light emitting element LD2 connected between the 2b-th electrode EL2b and the 3a-th electrode EL3a. For example, the second serial set SET2 may include the 2b-th electrode EL2*b* connected to the first driving power supply VDD via the pixel circuit 144 and the first serial set SET1, the 3a-th electrode EL3*a* connected to the second driving power supply VSS via the third serial stage SET3, and a plurality of second light emitting elements LD2 connected in parallel with each other between the 2b-th electrode EL2*b* and the 3a-th electrode EL3*a*. One end (e.g., second semiconductor layer) of each of the second light emitting elements LD2 may be electrically connected to the 2b-th electrode EL2*b* of the second serial set SET2, and the other end (e.g., first semiconductor layer) thereof may be electrically connected to the 3a-th electrode EL3*a* of the second serial set SET2. The second light emitting elements LD2 may be connected in parallel with each other between the 2b-th and 3a-th electrodes EL2*b* and EL3*a* of the second serial set SET2, and may be connected in the same direction (e.g., forward direction) between the first and second driving power supplies VDD and VSS through the 2b-th and 3a-th electrodes EL2*b* and EL3*a*.

According to one or more example embodiments, at least one reverse direction light emitting element LDr (see FIG. 5E) may be further connected between the 2b-th and 3a-th electrodes EL2*b* and EL3*a*. The reverse direction light emitting elements LDr may be connected in parallel between the 2b-th and 3a-th electrodes EL2*b* and EL3*a* together with the second light emitting elements LD2 constituting the effective light sources, but may be connected between the 2b-th and 3a-th electrodes EL2*b* and EL3*a* in the opposite direction to the second light emitting elements LD2.

In one or more example embodiments of the present disclosure, the 2a-th electrode EL2*a* of the first serial set SET1 and the 2b-th electrode EL2*b* of the second serial set SET2 may be integrally provided and connected to each other. For example, the 2a-th electrode EL2*a* of the first serial set SET1 and the 2b-th electrode EL2*b* of the second serial set SET2 may constitute the second electrode EL2 electrically connecting the first serial set SET1 and the second serial set SET2. As described above, when the 2a-th electrode EL2*a* of the first serial set SET1 and the 2b-th electrode EL2*b* of the second serial set SET2 are integrally provided, the 2a-th electrode EL2*a* and the 2b-th electrode EL2*b* may be different areas of the second electrode EL2.

The third serial set SET3 may include the 3b-th electrode EL3*b* and the fourth electrode EL4 from among the two electrodes (i.e., EL1 and EL2*a*, EL2*b* and EL3*a*, EL3*b* and EL4) constituting the electrode pair included in the light emitting unit EMU, and may include at least one third light emitting element LD3 connected to the 3b-th electrode EL3*b* and the fourth electrode EL4. For example, the third serial set SET3 may include the 3b-th electrode EL3*b* connected to the first driving power supply VDD via the pixel circuit 144 and previous serial sets, for example, first and second serial sets SET1 and SET2, the fourth electrode EL4 connected to the second driving power supply VSS, and a plurality of third light emitting elements LD3 connected in parallel with each other between the 3b-th electrode EL3*b* and the fourth electrode EL4. One end (e.g., second semiconductor layer) of each of the third light emitting elements LDE3 may be electrically connected to the 3b-th electrode EL3*b* of the third serial set SET3, and the other end (e.g., first semiconductor layer) thereof may be electrically connected to the fourth electrode EL4 of the third serial set SET3. The third light emitting elements LD3 may be connected in parallel with each other between the 3b-th electrode EL3*b* and the fourth electrode EL4 of the third serial set SET3, and may be connected in the same direction (e.g., forward direction) between the first and second driving power supplies VDD and VSS through the 3b-th electrode EL3*b* and the fourth electrode EL4.

According to one or more example embodiments, at least one reverse direction light emitting element LDr (see FIG. 5E) may be further connected between the 3b-th and fourth electrodes EL3*b* and EL4. The reverse direction light emitting elements LDr may be connected in parallel between the 3b-th and fourth electrodes EL3*b* and EL4 together with the third light emitting elements LD3 constituting the effective light sources, but may be connected between the 3b-th and fourth electrodes EL3*b* and EL4 in the opposite direction to the third light emitting elements LD3.

In one or more example embodiments of the present disclosure, the 3a-th electrode EL3*a* of the second serial set SET2 and the 3b-th electrode EL3*b* of the third serial set SET3 may be integrally provided and connected to each other. For example, the 3a-th electrode EL3*a* of the second serial set SET2 and the 3b-th electrode EL3*b* of the third serial set SET3 may constitute the third electrode EL3 electrically connecting the second serial set SET2 and the third serial set SET3. As described above, when the 3a-th electrode EL3*a* of the second serial set SET2 and the 3b-th electrode EL3*b* of the third serial set SET3 are integrally provided, the 3a-th electrode EL3*a* and the 3b-th electrode EL3*b* may be different areas of the third electrode EL3.

In the example embodiment described above, the first electrode EL1 of the first serial set SET1 may be the anode of the light emitting unit EMU of each first sub-pixel S-PXL1, and the fourth electrode EL4 of the third serial set SET3 may be a cathode of the light emitting unit EMU.

As described above, the light emitting unit EMU of the first sub-pixel S-PXL1 including the light emitting elements LD connected in series and/or in parallel mixed structure may adjust (e.g., easily adjust) the driving current and/or voltage condition according to the applied product specifications.

For example, the light emitting unit EMU of the pixels PXL including the light emitting elements LD connected in series and/or in parallel mixed structure may reduce the driving current compared to the light emitting unit EMU of the structure in which the light emitting elements LD are connected in parallel. In one or more embodiments, the light emitting unit EMU of the pixels PXL including the light emitting elements LD connected to in series and/or in parallel mixed structure may reduce the driving voltage applied to both ends of the light emitting unit EMU compared to the light emitting unit EMU of the structure in which the light emitting elements LD are all connected in series (as shown in FIG. 6A). In a case where all the light emitting elements LD are connected only in series, when at least one of the light emitting elements LD connected in series is not completely connected in the forward direction (or includes the reverse direction light emitting element LDr), the path through which the driving current can flow in the first sub-pixel S-PXL1 is blocked, thereby causing a dark spot defect. On the other hand, in a case where the light emitting elements LD are connected in series and/or in parallel mixed structure (e.g., as shown in FIG. 6B), even though some light emitting elements LD are not connected in a forward direction (or includes the light emitting element LDr in a reverse direction) in each serial set (e.g., first to third serial states SET1-SET3), or a defect occurs in some of the light emitting elements LD, the driving current may flow through another light emitting element LD in the corresponding serial set. Accordingly, the defect (e.g., a dark spot defect) of the first sub-pixel S-PXL1 may be prevented or reduced.

Figure 7:
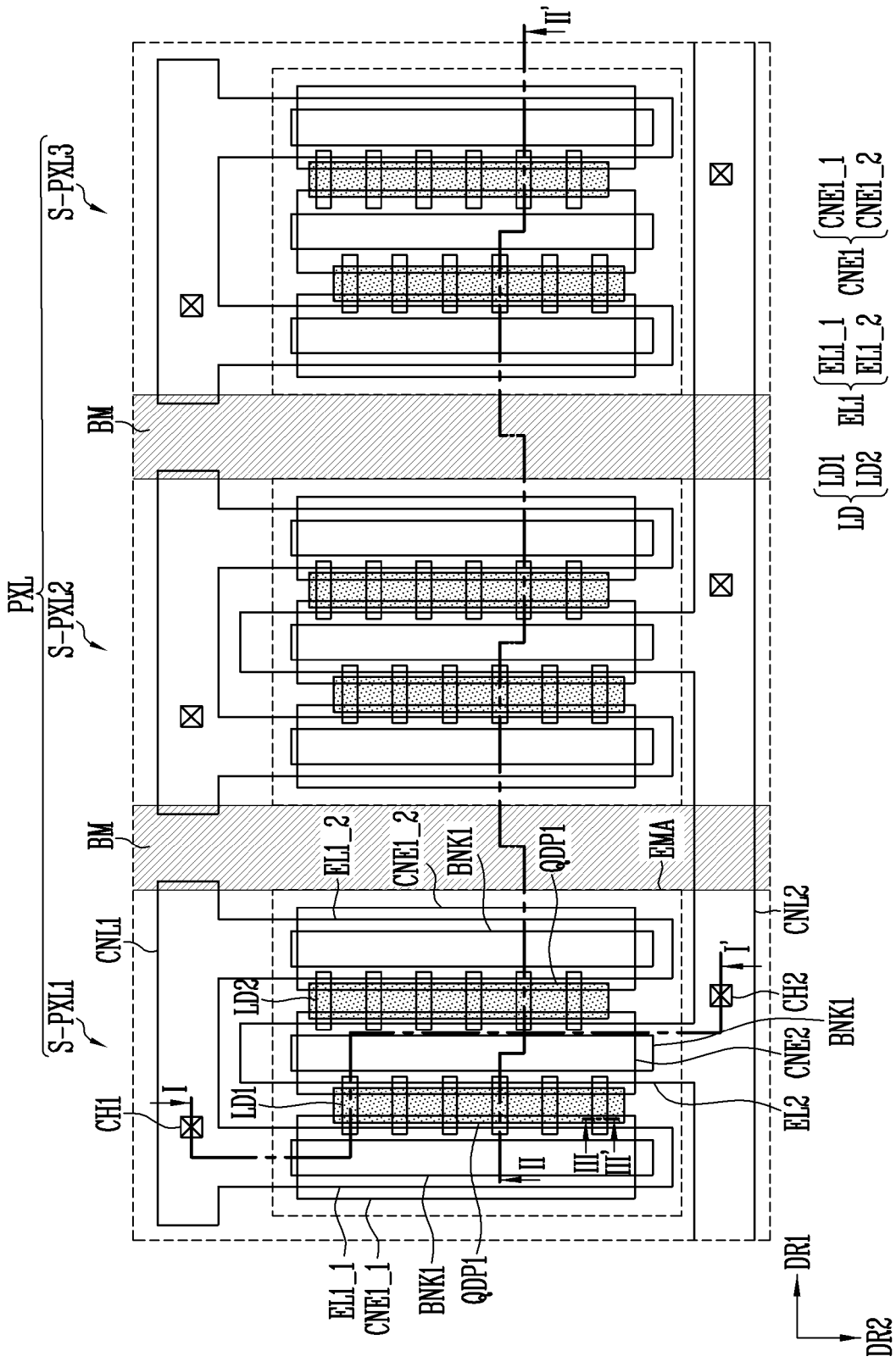
FIG. 7 is a top plan view that enlarges a pixel area of FIG. 4.
Figure 8:
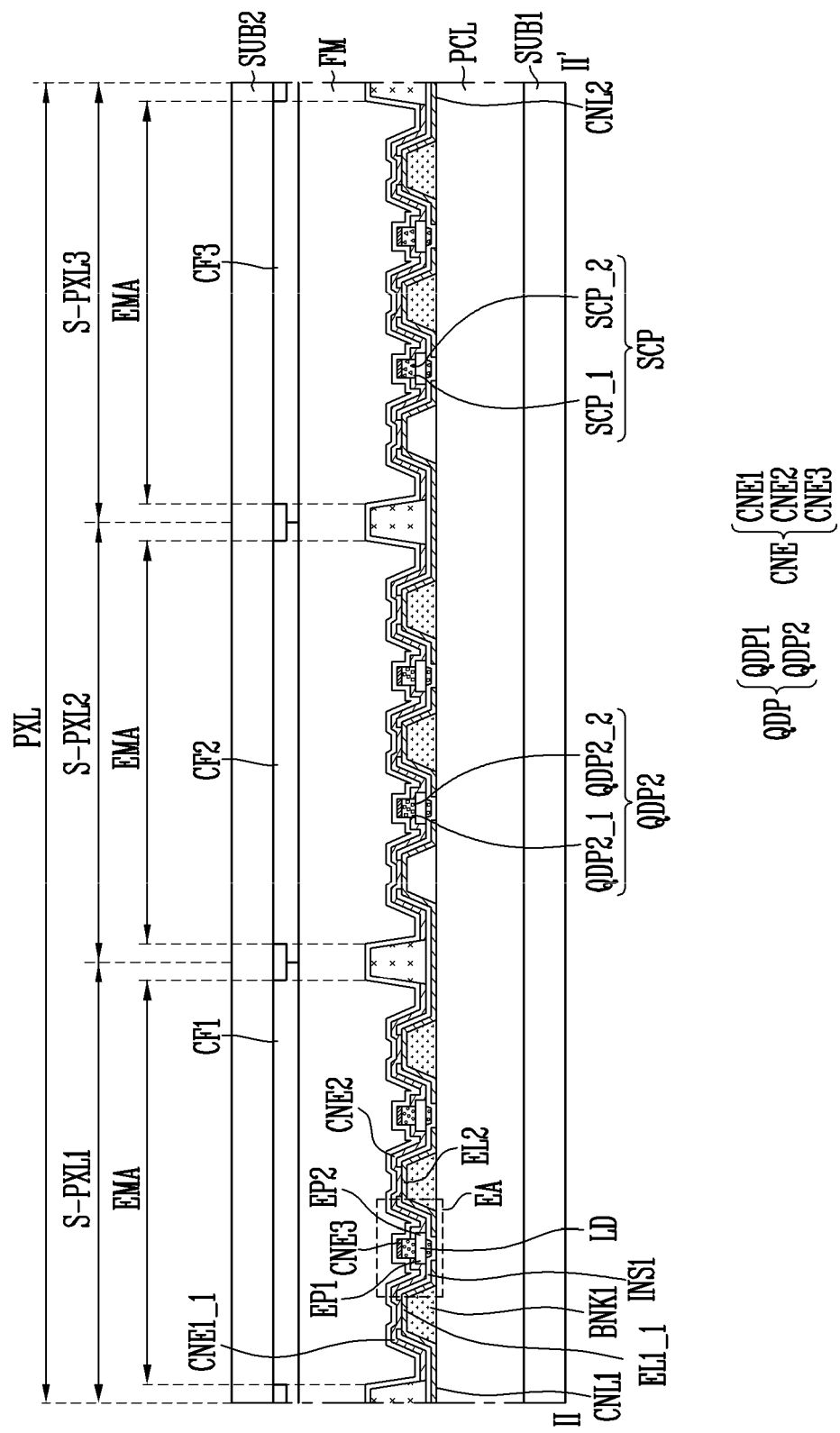
FIG. 8 is a cross-sectional view taken along the line II-II' of FIG. 7.
Figure 9:
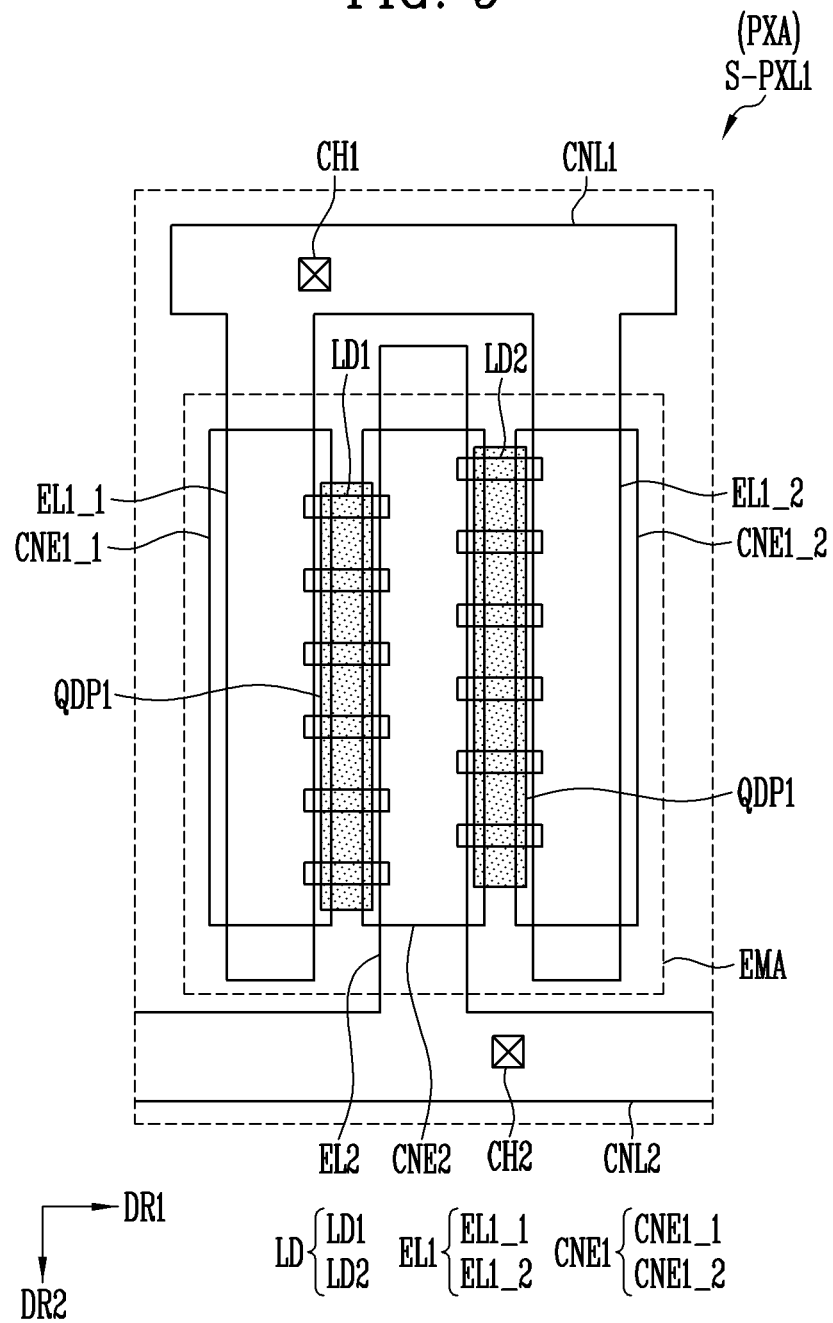
FIG. 9 is a top plan view schematically showing a first pixel including other constituent elements except for a first bank pattern in FIG. 7.
Figure 10:
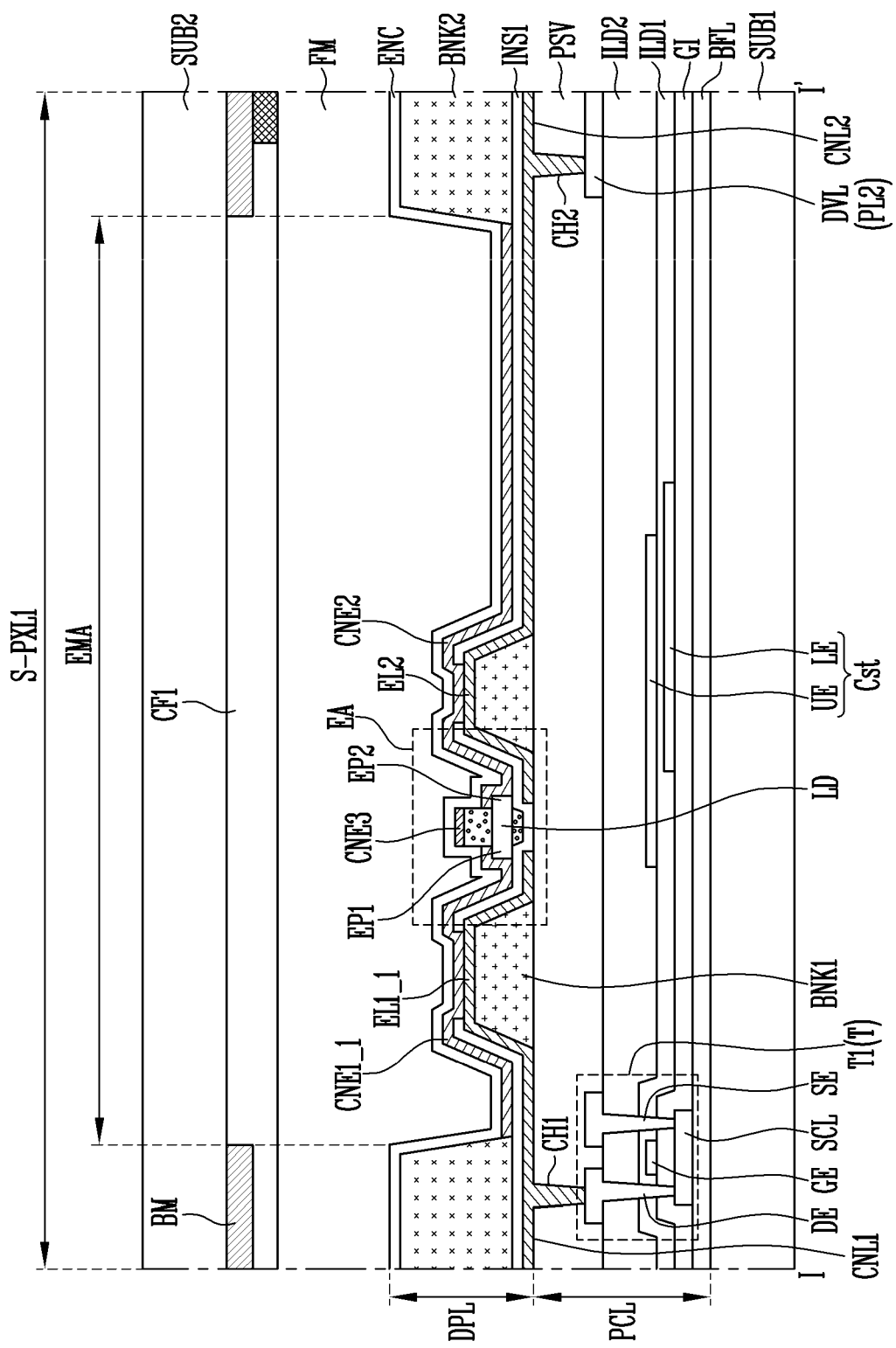
FIG. 10 is a cross-sectional view taken along the line I-I' of FIG. 7.
Figure 11A:
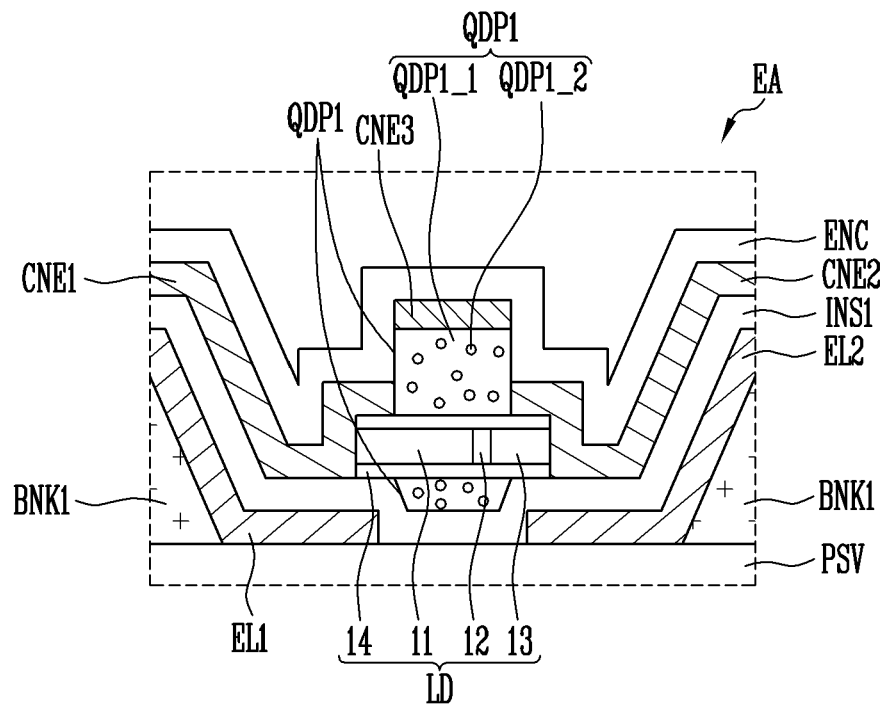
FIGS. 11A, 11B, and 11C are enlarged cross-sectional views of an area EA (e.g., a portion EA) of FIG. 10.
Figure 11B:
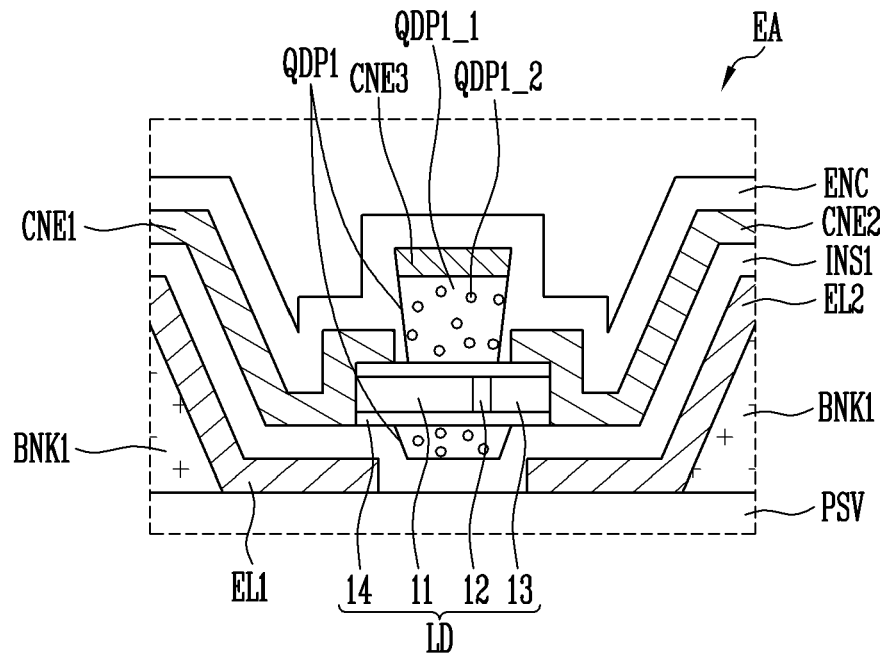
Figure 11C:
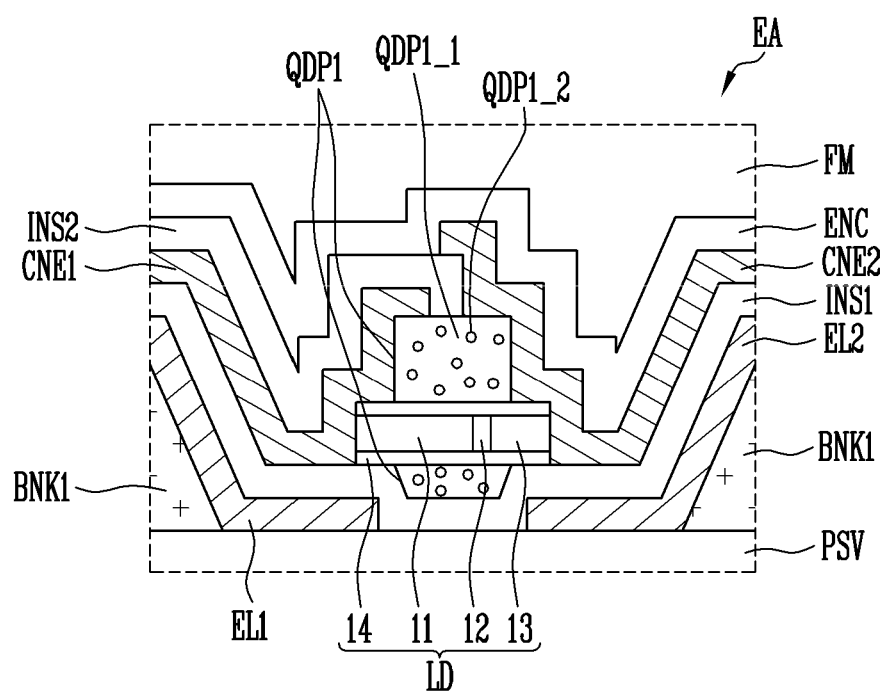
Figure 12:
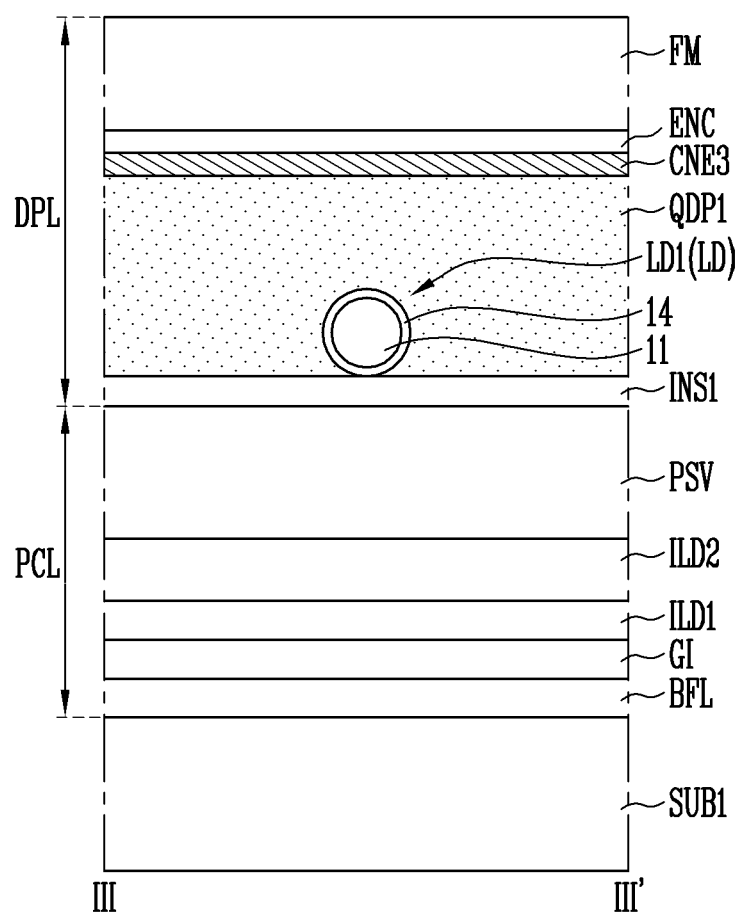
FIG. 12 is a cross-sectional view taken along line III-III' of FIG. 7.

FIG. 7 is a top plan view that enlarges a pixel area of FIG. 4, FIG. 8 is a cross-sectional view taken along the line II-II' of FIG. 7, FIG. 9 is a top plan view schematically showing a first pixel including other constituent elements except for a first bank pattern in FIG. 7, FIG. 10 is a cross-sectional view taken along the line I-I' of FIG. 7, FIGS. 11A, 11B and 11C are enlarged cross-sectional views of an EA portion of FIG. 10, and FIG. 12 is a cross-sectional view taken along the line III-III' of FIG. 7.

The first to third sub-pixels S-PXL1, S-PXL2, and S-PXL3 shown in FIG. 7 may be any one of the first sub-pixel S-PXL1 shown in each of FIGS. 5A-5E, 6A, and 6B. For example, each of the first to third sub-pixels S-PXL1, S-PXL2, and S-PXL3 shown in FIG. 7 may be the first sub-pixel S-PXL1 shown in FIG. 5A.

In FIG. 7, for better understanding and ease of description, illustration of a transistor connected to the light emitting elements and signal lines connected to the transistor will be omitted.

In FIGS. 7-12, the structure of one sub-pixel S-PXL1, S-PXL2, and S-PXL3 is simplified by showing each electrode as a single electrode layer and each insulation layer as a single insulation layer, but the present disclosure is not limited thereto.

In one or more example embodiments of the present disclosure, "formed and/or provided at the same layer" (or on the same layer) refers to be formed in the same process, and "formed and/or provided on different layers" refers to be formed in different processes.

Referring to FIGS. 1A-4, 5A, 7-12, a display device according to one or more example embodiments of the present disclosure includes a first substrate SUB1 that provides or forms a pixel circuit unit PCL and a display element unit DPL (e.g., as shown in FIG. 10, the pixel circuit unit PCL may be on the first substrate SUB1, and a display element unit DPL may be on the pixel circuit unit PCL), a second substrate SUB2 that provides or forms color filters CF1, CF2, and CF3 and a light blocking pattern BM, and a filler FM interposed between the first substrate SUB1 and the second substrate SUB2.

The first to third sub-pixels S-PXL1 to S-PXL3 may be provided or formed on the first substrate SUB1. Each of the first to third sub-pixels S-PXL1 to S-PXL3 may be a pixel area for displaying an image, and may be a light emission area in which light is emitted.

A sub-pixel S-PXL (e.g., first, second, or third sub-pixels S-PXL1, SPXL2, or S-PXL3) may include a light emitting device that emits white light and/or color light. For example, the light emitting element may emit blue light, and the first to third sub pixels S-PXL1, S-PXL2, and S-PXL3 may emit red, green, and blue light, respectively. However, the present disclosure is not limited thereto. For example, each of the first to third sub-pixels S-PXL1, S-PXL2, and S-PXL3 may emit any one of cyan, magenta, yellow, and white color lights.

Each of the first to third sub-pixels S-PXL1, S-PXL2, and S-PXL3 may include the first substrate SUB1, the pixel circuit unit PCL provided on the first substrate SUB1, and a display element unit DPL provided on the pixel circuit unit PCL (e.g., see FIG. 10).

The first substrate SUB1 may include a transparent insulation material to transmit light. The first substrate SUB1 may be a rigid substrate or a flexible substrate.

The rigid substrate may be, for example, one of a glass substrate, a quartz substrate, a glass ceramic substrate, and a crystalline glass substrate. The flexible substrate may be one of a film substrate including a polymer organic material and a plastic substrate. For example, the flexible substrate may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials constituting the first substrate SUB1 may be variously changed, and may also include fiber reinforced plastic (FRP). The material applied to the first substrate SUB1 may have resistance (or heat resistance) to a high processing temperature during the manufacturing process of the display device.

The first substrate SUB1 includes a display area DA including at least one pixel area PXA in which a plurality of sub-pixels S-PXL1, S-PXL2, and S-PXL3 are located, and a non-display area NDA located around the display area DA (e.g., see FIG. 4).

The pixels PXL may be arranged in a matrix form and/or a stripe form along a plurality of pixel rows extending in the first direction DR1 and a plurality of pixel columns extending in the second direction DR2 crossing the first direction DR1 in the display area DA on the first substrate SUB1, but the present disclosure is not limited thereto. According to one or more example embodiments, the pixels PXL may be provided in the display area DA on the first substrate SUB1 in various arrangement forms.

The pixel area PXA in which each of the sub-pixels S-PXL1, S-PXL2 and S-PXL3 is located (or provided) may include a light emitting area EMA in which light is emitted and a peripheral area surrounding the light emitting area EMA. In one or more example embodiments of the present disclosure, the peripheral area may include a non-emission area in which light is not emitted.

Each of the sub-pixels S-PXL1, S-PXL2, and S-PXL3 may include a pixel circuit unit PCL provided on the first substrate SUB1 and a pixel circuit 144, and a display element unit DPL including a plurality of light emitting elements LD. The light emitting elements LD may be located in the light emitting area EMA of the pixel area PXA in each of the sub-pixels S-PXL1, S-PXL2, and S-PXL3.

For better understanding and ease of description, the pixel circuit unit PCL will be first described, and then the display element unit DPL will be described.

The pixel circuit unit PCL may include a buffer layer BFL, a pixel circuit 144 including at least one transistor T, a storage capacitor Cst, a driving voltage line DVL, and a protective layer PSV (e.g., see FIG. 10).

The buffer layer BFL may prevent impurities from diffusing into the transistor T (e.g., the buffer layer BFL may protect the transistor T from diffusion of impurities from outside into the transistor T). The buffer layer BFL may be provided as a single layer, but may also be provided as a multiple layer having at least a double layer. When the buffer layer BFL is provided as a multiple layer, each layer may be formed of the same material or different materials. The buffer layer BFL may be omitted depending on the material and process conditions of the first substrate SUB1.

The transistor T may include a first transistor T1 that is a driving transistor that controls an amount of the driving current supplied to the light emitting elements LD, and a second transistor T2 that is a switching transistor. In one or more example embodiments of the present disclosure, the first transistor T1 may be the first transistor T1 of the pixel circuit 144 described with reference to FIG. 5A, and the second transistor T2 may be the second transistor T2 of the pixel circuit 144 described with reference to FIG. 5A. In the following embodiment, when one of the first and second transistors T1 and T2 is arbitrarily referred to, it is referred to a transistor T or transistors T, or when the first and second transistors T1 and T2 are collectively named, they are referred to a transistor T or transistors T.

For example, as shown in FIG. 10, each of the first transistor T1 and the second transistor T2 may include a transistor semiconductor pattern SCL, a gate electrode GE, a first terminal SE (e.g., a source electrode), and a second terminal DE (e.g., a drain electrode). The first terminal SE may be one of the source electrode and the drain electrode, and the second terminal DE may be the other one of the electrodes from the source electrode and the drain electrode of the transistor T thereof. For example, when the first terminal SE is a source electrode, the second terminal DE may be a drain electrode.

The transistor semiconductor pattern SCL may be provided and/or formed on the buffer layer BFL. The transistor semiconductor pattern SCL may include a first contact region contacting the first terminal SE and a second contact region contacting the second terminal DE. A region between the first contact region and the second contact region may be a channel region. The transistor semiconductor pattern SCL may be a semiconductor panel made of at least one selected from the group consisting of polysilicon, amorphous silicon, oxide semiconductor, or the like. The channel region may be a semiconductor pattern in which impurities are not doped, and may be an intrinsic semiconductor. The first contact region and the second contact region may be semiconductor patterns doped with impurities (e.g., n-type impurities or p-type impurities).

The gate electrode GE may be provided and/or formed on the transistor semiconductor pattern SCL with a gate insulation layer GI interposed therebetween.

The first terminal SE and the second terminal DE may respectively contact the first contact region and the second contact region of the transistor semiconductor pattern SCL through respective contact holes passing through first and second interlayer insulation layers ILD1 and ILD2 and the gate insulation layer GI.

In the above-described embodiment, the first and second terminals SE and DE in each of the first transistor T1 and the second transistor T2 are described as separate electrodes electrically connected to the transistor semiconductor pattern SCL through a contact hole passing through the gate insulation layer GI, and the first and second interlayer insulation layers ILD1 and ILD2, but the present disclosure is not limited thereto. According to one or more example embodiments, the first terminal SE in each of the first transistor T1 and the second transistor T2 may be one of the first and second contact regions adjacent to the channel region of the corresponding transistor semiconductor pattern SCL, and the second terminal DE in each of the first transistor T1 and the second transistor T2 may be the other one of the first and second contact regions adjacent to the channel region of the corresponding transistor semiconductor pattern SCL. In this case, the second terminal DE in each of the first transistor T1 and the second transistor T2 may be electrically connected to the light emitting elements LD of the corresponding sub-pixels S-PXL1, S-PXL2, and S-PXL3 through a bridge electrode or a contact electrode (e.g., CNE1_1 of FIG. 10).

In one or more example embodiments of the present disclosure, the transistors T included in the pixel circuit 144 may be composed of a low-temperature polycrystalline silicon (LTPS) thin film transistor (TFT), but the present disclosure is not limited thereto, and according to one or more example embodiments, they may be composed of an oxide semiconductor thin film transistor or any suitable transistor known to those skilled in the art. A case where the transistors T are thin film transistors having a top gate structure is described as an example embodiment, but the present disclosure is not limited thereto. According to one or more example embodiments, the transistors T may be thin film transistors having a bottom gate structure.

According to one or more example embodiments, the transistor T included in the pixel circuit unit PCL may further include additional transistors, such as, a transistor for compensating a threshold voltage of the first transistor T1, and a transistor for controlling a light emission time in each of the light emitting elements LD in addition to the first and second transistors T1 and T2 described above.

The storage capacitor Cst may include a lower electrode LE provided on the gate insulation layer GI, and an upper electrode UE provided on the first interlayer insulation layer ILD1 and overlapping the lower electrode LE.

The lower electrode LE may be provided at the same layer as the gate electrode GE of the first transistor T1 and may include the same material. According to one or more example embodiments, the lower electrode LE may be provided integrally with the gate electrode GE of the first transistor T1 or may be provided in a separate configuration from the gate electrode GE.

The upper electrode UE may overlap the lower electrode LE and may cover the lower electrode LE. The capacitance of the storage capacitor Cst may be increased by increasing an overlapping area between the upper electrode UE and the lower electrode LE. The upper electrode UE may be electrically connected to the first power line PL1 (see FIG. 5A). Accordingly, the first driving power supply VDD applied to the first power line PL1 may be transferred to the upper electrode UE. A second interlayer insulation layer ILD2 may be provided on the upper electrode UE. The second interlayer insulation layer ILD2 may be an inorganic insulation layer including an inorganic material or an organic insulation layer including an organic material.

The driving voltage line DVL may be provided on the second interlayer insulation layer ILD2. The driving voltage line DVL may be a second power line PL2 through which the second driving power supply VSS is applied in the sub-pixels S-PXL1, S-PXL2, and S-PXL3 (e.g., as shown in FIG. 5A).

A protective layer PSV may be provided and/or formed on the driving voltage line DVL and the transistors T.

The protective layer PSV may be provided in the form of an organic insulation layer, an inorganic insulation layer, or the organic insulation layer located on the inorganic insulation layer. Here, the inorganic insulation layer may include at least one of metal oxides such as silicon oxide (SiOx), silicon nitride (SiNx), silicon oxynitride (SiONx), and aluminum oxide (AlOx). The organic insulation layer may include an organic insulation material capable of transmitting light. The organic insulation layer may include at least one selected from the group consisting of polyacrylates resin, epoxy resin, phenolic resin, polyamides resin, polyimide resin, unsaturated polyester resin, poly-phenylen ethers resin, poly-phenylene sulfides resin, and benzocyclobutene resin.

Next, the display element unit DPL in each of the sub-pixels S-PXL1, S-PXL2, and S-PXL3 will be described. Because each of the first to third sub-pixels S-PXL1, S-PXL2, and S-PXL3 has the same structure, a description thereof will be given based on the first sub-pixel S-PXL1 and overlapped descriptions of the second and third sub-pixels S-PXL2 and S-PXL3 will be omitted below.

The display element unit DPL may include first and second bank patterns BNK1 and BNK2, first and second electrodes EL1 and EL2, first and second connection lines CNL1 and CNL2, light emitting elements LD, and contact electrodes CNE1 (e.g., CNE1_1) and CNE2.

The first bank pattern BNK1 may be a support member supporting each of the first and second electrodes EL1 and EL2 to change a surface profile in each of the first and second electrodes EL1 and EL2 so that light emitted from the light emitting elements LD may further progress in an image display indirection in the display device.

The first bank pattern BNK1 may be provided and/or formed between the protective layer PSV and the first and second electrodes EL1 and EL2 in the light emitting area EMA of the first sub-pixel S-PXL1. For example, the first bank pattern BNK1 may be provided and/or formed between the protective layer PSV and the first electrode EL1 and between the protective layer PSV and the second electrode EL2, respectively. The first bank pattern BNK1 may include an inorganic insulation layer made of an inorganic material or an organic insulation layer made of an organic material. According to one or more example embodiments, the first bank pattern BNK1 may include an organic insulation layer of a single layer and/or an inorganic insulation layer of a single layer, but the present disclosure is not limited thereto. According to one or more example embodiments, the first bank pattern BNK1 may be provided in the form of a multiple layer in which at least one organic insulation layer and at least one inorganic insulation layer are stacked. However, the material of the first bank pattern BNK1 is not limited to the above-described embodiments, and according to one or more example embodiments, the first bank pattern BNK1 may include a conductive material.

The first bank pattern BNK1 may have a cross-section of a trapezoidal shape which becomes narrower as it goes upward from one surface of the protective layer PSV, but the present disclosure is not limited thereto. For example, the first bank pattern BNK1 may include a curved surface having a cross-section of a semi-elliptical shape, a semi-circular shape (or hemisphere shape), and the like which becomes narrower as it goes upward from one surface of the protective layer PSV. When viewed in a cross-section, the shape of the first bank pattern BNK1 is not limited to the above-described embodiments and may be variously changed within a range capable of improving efficiency of light emitted from each of the light emitting elements LD. The first bank patterns BNK1 adjacent to each other may be located at the same plane on the protective layer PSV, and may have the same height (or thickness) with each other.

The first bank pattern BNK1 may have a bar shape extending in one direction, for example, the second direction DR2 (i.e., vertical direction) when viewed in a plane, but the present disclosure is not limited thereto, and may be changed to various shapes.

The second bank pattern BNK2 may surround at least one side of the peripheral area of the first sub-pixel S-PXL1. The second bank pattern BNK2 may be a structure that defines (or partitions) the light emitting area EMA in each of the first sub-pixel S-PXL1 and the second and third sub-pixels S-PXL2 and S-PXL3 adjacent thereto, and for example, it may be a pixel definition layer. The second bank pattern BNK2 is configured to include at least one light blocking material and/or a reflective material, and may prevent (or reduce) a light leakage defect between the first sub-pixel S-PXL1 and the second and third sub-pixels S-PXL2 and S-PXL3 adjacent thereto. According to one or more example embodiments, a reflective material layer may be formed on the second bank pattern BNK2 to further improve the efficiency of light emitted from the first sub-pixel S-PXL1. The second bank pattern BNK2 may be formed and/or provided on a different layer from the first bank pattern BNK1, but the present disclosure is not limited thereto, and according to one or more example embodiments, the second bank pattern BNK2 may be formed and/or provided at the same layer as the first bank pattern BNK1. In one or more example embodiments of the present disclosure, the second bank pattern BNK2 may be formed on a different layer from the first bank pattern BNK1, and may be located on the first insulation layer INS1.

The first connection line CNL1 may extend in the first direction DR1 (e.g., horizontal direction) in each of the first, second, and third sub-pixels S-PXL1, S-PXL2, and S-PXL3. The first connection line CNL1 may be provided and/or formed in each of the first, second, and third sub-pixels S-PXL1, S-PXL2 and S-PXL3, and may be electrically and/or physically separated from the first connection line CNL1 provided and/or formed in the adjacent sub-pixels from among the first, second, and third sub-pixels S-PXL1, S-PXL2 and S-PXL3 to independently or individually drive each of the first, second, and third sub-pixels S-PXL1, S-PXL2, and S-PXL3 from the adjacent sub-pixels (e.g., adjacent sub-pixels from among the first, second, and third sub-pixels S-PXL1, S-PXL2, and S-PXL3). The first connection line CNL1 provided in each of the first, second, and third sub-pixels S-PXL1, S-PXL2, and S-PXL3 may be electrically connected to some components included in the pixel circuit unit PCL of the corresponding sub-pixel (e.g., corresponding sub-pixel from among the first, second, and third sub-pixels S-PXL1, S-PXL2, and S-PXL3). For example, as shown in FIG. 10, the first connection line CNL1 of the first sub-pixel S-PXL1 may be connected to the first transistor T1 of the first sub-pixel S-PXL1 through a first contact hole CH1 passing through the protective layer PSV.

The second connection line CNL2 may extend in a direction parallel to the extending direction of the first connection line CNL1. For example, second connecting line CNL2 may extend in the first direction DR1. The second connection line CNL2 may be commonly provided in each of the first, second, and third sub-pixels S-PXL1, S-PXL2, and S-PXL3 and the sub-pixels S-PXL1, S-PXL2, and S-PXL3 adjacent thereto (e.g., adjacent sub-pixels from among the first, second, and third sub-pixels S-PXL1, S-PXL2, and S-PXL3). Accordingly, a plurality of sub-pixels S-PXL1, S-PXL2, and S-PXL3 located in the same pixel row in the first direction DR1 may be commonly connected to the second connection line CNL2. The second connection line CNL2 provided in each of the first, second, and third sub-pixels S-PXL1, S-PXL2, and S-PXL3 may be electrically connected to some components included in the pixel circuit unit PCL of the corresponding sub-pixel (e.g., corresponding sub-pixel from among the first, second, and third sub-pixels S-PXL1, S-PXL2, and S-PXL3). For example, the second connection line CNL2 of the first sub-pixel S-PXL1 may be connected to the driving voltage line DVL through a second contact hole CH2 passing through the protective layer PSV. Accordingly, the second driving power supply VSS applied to the driving voltage line DVL may be transferred to the second connection line CNL2.

Each of the first and second electrodes EL1 and EL2 may be provided in the light emitting area EMA of the first sub-pixel S-PXL1, and may extend in one direction, for example, the second direction DR2. The first electrode EL1 and the second electrode EL2 may be provided at the same surface and may be spaced from each other.

The first electrode EL1 may include a 1-1-th electrode EL1_1 and a 1-2-th electrode EL1_2 branched from the first connection line CNL1 in the second direction DR2 (e.g., as shown in FIG. 7). The 1-1-th electrode EL1_1, the 1-2-th electrode EL1_2, and the first connection line CNL1 may be integrally provided or formed and may be electrically and/or physically connected to each other. When the first electrode EL1 and the first connection line CNL1 are integrally provided or formed, the first connection line CNL1 may be one region of the first electrode EL1, or the first electrode EL1 may be one region of the first connection line CNL1. However, the present disclosure is not limited thereto, and according to one or more example embodiments, the first electrode EL1 and the first connection line CNL1 are formed separately from each other, and may be electrically connected to each other through contact holes and connection means not shown.

The second electrode EL2 may be branched from the second connection line CNL2 in the second direction DR2. The second electrode EL2 may be provided integrally with the second connection line CNL2, and may be electrically and/or physically connected to each other. When the second electrode EL2 and the second connection line CNL2 are integrally provided, the second connection line CNL2 may be one region of the second electrode EL2, or the second electrode EL2 may be one region of the connection line CNL2. However, the present disclosure is not limited thereto, and according to one or more example embodiments, the second electrode EL2 and the second connection line CNL2 may be formed separately from each other, and may be electrically connected to each other through contact holes and connection means not shown.

The second electrode EL2 may be located between the 1-1-th electrode EL1_1 and the 1-2-th electrode EL1_2. The 1-1-th electrode EL1_1 and the second electrode EL2 may be spaced from each other, and the second electrode EL2 and the 1-2-th electrode EL1_2 may be spaced from each other. In the light emitting area EMA of the first sub-pixel S-PXL1, a distance between the 1-1-th electrode EL1_1 and the second electrode EL2 may be the same as a distance between the second electrode EL2 and the 1-2-th electrode EL1_2. Accordingly, the light emitting elements LD may be more uniformly aligned between the 1-1-th electrode EL1_1 and the second electrode EL2 and/or the second electrode EL2 and the 1-2-th electrode EL1_2 in the light emitting area EMA of the first sub-pixel S-PXL1. However, the present disclosure is not limited thereto, and according to one or more example embodiments, the distance between the 1-1-th electrode EL1_1 and the second electrode EL2 may be different from the distance between the second electrode EL2 and the 1-2-th electrode EL1_2.

Each of the first and second electrodes EL1 and EL2 may be provided and/or formed on the first bank pattern BNK1 to have a surface profile corresponding to a shape of the first bank pattern BNK1. For example, each of the first and second electrodes EL1 and EL2 may include a protruding portion corresponding to the first bank pattern BNK1 and a flat portion corresponding to the protective layer PSV. Each of the first and second electrodes EL1 and EL2 may be made of a material having a constant reflectance so that light emitted from each of the light emitting elements LD may progress in an image display direction of the display device.

Each of the first and second electrodes EL1 and EL2 may be made of a conductive material having a constant reflectance. The conductive material may include an opaque metal that is suitable for reflecting the light emitted from the light emitting elements LD in the image display direction of the display device. The opaque metal may include, for example, metals such as Ag, Mg, Al, Pt, Pd, Au, Ni, Nd, Ir, Cr, Ti, and alloys thereof. According to one or more example embodiments, each of the first and second electrodes EL1 and EL2 may include a transparent conductive material. The transparent conductive material may include conductive oxides such as indium tin oxide (ITO), indium zinc oxide (IZO), zinc oxide (ZnO), indium tin zinc oxide (ITZO), and conductive polymers such as Poly(3,4-ethylenedioxythiophene) (PEDOT). When each of the first and second electrodes EL1 and EL2 includes a transparent conductive material, a separate conductive layer made of an opaque metal for reflecting the light emitted from the light emitting elements LD in the image display direction of the display device, may be added. However, the material of each of the first and second electrodes EL1 and EL2 is not limited to the above-described materials.

In one or more example embodiments, each of the first and second electrodes EL1 and EL2 may be provided and/or formed as a single layer, but the present disclosure is not limited thereto. According to one or more example embodiments, each of the first and second electrodes EL1 and EL2 may be provided and/or formed as a multiple layer in which at least two materials or more of metals, alloys, conductive oxides, and conductive polymers are stacked. Each of the first and second electrodes EL1 and EL2 may be made up of a multiple layer of at least double layers or more to minimize or reduce distortion caused by a signal delay when transferring a signal (or voltage) to both ends of each of the light emitting elements LD. For example, each of the first and second electrodes EL1 and EL2 may be made up of a multiple layers stacked in the order of indium tin oxide (ITO)/silver (Ag)/indium tin oxide (ITO).

When the first connection line CNL1 may be provided integrally with the first electrode EL1, the first connection line CNL1 may include the same material as the first electrode EL1. In one or more example embodiments, when the second connection line CNL2 is provided integrally with the second electrode EL2, the second connection line CNL2 may include the same material as the second electrode EL2.

As described above, because each of the first and second electrodes EL1 and EL2 has a surface profile corresponding to the shape of the first bank pattern BNK1 located thereunder, the light emitted from each of the light emitting elements LD may be reflected by each of the first and second electrodes EL1 and EL2, and may further progress in the image display direction of the display device. As a result, the efficiency of the light emitted from each of the light emitting elements LD can be further improved.

Each of the first bank pattern BNK1, the first and second electrodes EL1, EL2 may functions as a reflective member that induces light emitted from the light emitting elements LD in a desired direction to improve light efficiency of the display device. That is, each of the first bank pattern BNK1, the first and second electrodes EL1, EL2 may cause the light emitted from the light emitting elements LD to progress in the image display direction of the display device, and can function as a reflective member that improves the light output efficiency of the light emitting elements LD.

One of the first electrode EL1 and the second electrode EL2 may be an anode electrode, and the other electrode thereof may be a cathode electrode. In one or more example embodiments of the present disclosure, the first electrode EL1 may be an anode electrode, and the second electrode EL2 may be a cathode electrode.

Each of the light emitting elements LD may be a light emitting element having an ultra-small size using a material of an inorganic crystal structure, for example, a small size, such as a nano-scale to a micro-scale. For example, each of the light emitting elements LD may be an ultra-small light emitting element manufactured by an etch method or an ultra-small light emitting element manufactured by a growth method. For example, as shown in FIG. 11, each of the light emitting elements LD may be a light emitting element including an emission stacked pattern sequentially stacked in the order of a first semiconductor layer 11, an active layer 12, and a second semiconductor layer 13 in a length direction (or first direction DR1), and an insulation layer 14 covering an outer surface (e.g., an outer peripheral surface) of the emission stacked pattern, and manufactured by the etch method. However, the type, size, and shape of the light emitting elements LD may be variously changed.

At least two to tens of light emitting elements LD may be aligned and/or provided in the light emitting area EMA of the first sub-pixel S-PXL1, but the number of the light emitting elements LD is not limited thereto. According to one or more example embodiments, the number of light emitting elements LD aligned and/or provided in the light emitting area EMA of the first sub-pixel S-PXL1 may be variously changed.

In one or more example embodiments of the present disclosure, each of the light emitting elements LD may emit any one of color light and/or white light. Each of the light emitting elements LD may be aligned between the first electrode EL1 and the second electrode EL2 such that the length direction L thereof is parallel to the first direction DR1. The light emitting elements LD may be provided in a form sprayed in a solution to be injected into the light emitting area EMA of the first sub-pixel S-PXL1.

In one or more example embodiments of the present disclosure, the light emitting elements LD may be injected to the light emitting area EMA of the first sub-pixel S-PXL1 by using an inkjet printing method, a slit coating method, or other various methods. For example, the light emitting elements LD may be mixed with a volatile solvent and may be supplied to the light emitting region EMA of the first sub-pixel S-PXL1 by using an inkjet printing method or a slit coating method. In this case, when an alignment signal (or alignment voltage) corresponding to each of the first and second electrodes EL1 and EL2 located in the light emitting area EMA of the first sub-pixel S-PXL1 is applied, an electric field may be formed between the first electrode EL1 and the second electrode EL2. Therefore, the light emitting elements LD may be aligned between the first electrode EL1 and the second electrode EL2.

After the light emitting elements LD are aligned, the light emitting elements LD may be finally aligned and/or provided in the light emitting area EMA of the first sub-pixel S-PXL1 by volatilizing the solvent or removing the solvent in other ways.

When the light emitting elements LD are aligned in the light emitting area EMA of the first sub-pixel S-PXL1, each of the first and second electrodes EL1 and EL2 may receive a suitable alignment voltage (e.g., a set alignment signal/voltage or a predetermined alignment signal/voltage) to function as an alignment electrode (or alignment line) for alignment of the light emitting elements LD. For example, the first electrode EL1 may be a first alignment electrode (or first alignment line) receiving the first alignment signal (or first alignment voltage) from the first connection line CNL1, and the second electrode EL2 may be a second alignment electrode (or second alignment line) receiving the second alignment signal (or second alignment voltage) from the second connection line CNL2. The first and second alignment signals may have different voltage levels from each other. The first and second alignment signals may be signals having a voltage difference and/or a phase difference so that the light emitting elements LD may be aligned between the first and second electrodes EL1 and EL2. For example, the first alignment signal may be a ground voltage (GND), and the second alignment signal may be an AC signal, but the present disclosure is not limited thereto. According to one or more example embodiments, both the first and second alignment signals may be AC signals.

After the light emitting elements LD are aligned in the light emitting area EMA of the first sub-pixel S-PXL1, the first and second electrodes EL1 and EL2 may function as a driving electrode for driving the light emitting elements LD.

The light emitting elements LD supplied to the light emitting area EMA may be aligned and may be relatively deflected by controlling the alignment signal (or alignment voltage) applied to each of the first and second electrodes EL1 and EL2, or by forming a magnetic field when aligning the light emitting elements LD in the light emitting area EMA of the first sub-pixel S-PXL1.

Each of the light emitting elements LD may include a first end EP1 electrically connected to one of two adjacent electrodes from among the first and second electrodes EL1 and EL2 in the light emitting area EMA of the first sub-pixel S-PXL1, and a second end EP2 electrically connected to the other one of the two adjacent electrodes from among the first and second electrodes EL1 and EL2. In one or more example embodiments of the present disclosure, the first end EP1 of each light emitting element LD may be a first semiconductor layer 11 including an n-type semiconductor layer, and the second end EP2 thereof may be a second semiconductor layer 13 including a p-type semiconductor layer. For example, in the light emitting area EMA of the first sub-pixel S-PXL1, each light emitting element LD may be connected in a forward direction between two adjacent electrodes with an interval (e.g., a set interval or a predetermined interval) therebetween. As described above, the light emitting elements LD connected in the forward direction between two adjacent electrodes may constitute effective light sources of the light emitting unit EMU of the first sub-pixel S-PXL1.

As shown in FIG. 7, the light emitting elements LD may include first and second light emitting elements LD1 and LD2. For example, the light emitting elements LD may include a plurality of first light emitting elements LD1 located between the 1-1-th electrode EL1_1 and the second electrode EL2, and a plurality of second light emitting elements LD2 located between the second electrode EL2 and the 1-2-th electrode EL1_2.

The above-described light emitting elements LD may be provided and/or formed on the first insulation layer INS1 in the light emitting area EMA of the first sub-pixel S-PXL1.

The first insulation layer INS1 may be formed and/or provided under each of the light emitting elements LD in the light emitting area EMA of the first sub-pixel S-PXL1. The first insulation layer INS1 may fill a space between each of the light emitting elements LD and the protective layer PSV to stably support the light emitting elements LD, and may prevent the light emitting elements LD from deviating from the protective layer PSV.

In one or more example embodiments, in the light emitting area EMA of the first sub-pixel S-PXL1, the first insulation layer INS1 may expose one region of each of the first and second electrodes EL1 and EL2, and may cover a remaining region excluding the one region. Here, contact electrodes CNE1 and CNE2 to be described later may be provided and/or formed on one region of each of the exposed first and second electrodes EL1 and EL2, so that the first electrode EL1 and the first contact electrode CNE1 may be electrically and/or physically connected, and the second electrode EL2 and the second contact electrode CNE2 may be electrically and/or physically connected.

The first insulation layer INS1 may include an inorganic insulation layer made of an inorganic material or an organic insulation layer made of an organic material. In one or more example embodiments of the present disclosure, the first insulation layer INS1 may be made of an inorganic insulation layer that is suitable for protecting the light emitting elements LD from the pixel circuit unit PCL of the first sub-pixel S-PXL1, but the present disclosure is not limited thereto. According to one or more example embodiments, the first insulation layer INS1 may be made of an organic insulation layer that is suitable for flattening a support surface of the light emitting elements LD.

As shown in FIG. 9, a light conversion pattern QDP may be provided and/or formed on each of the light emitting elements LD. The light conversion pattern QDP may be provided and/or formed on each of the light emitting elements LD to cover a portion of the upper surface of each of the light emitting elements LD, and to expose both ends EP1 and EP2 of each of the light emitting elements LD to the outside. The light conversion pattern QDP may be formed as an independent insulation pattern on the light emitting area EMA of the first sub-pixel S-PXL1, but the present disclosure is not limited thereto.

The light conversion pattern QDP may further fix each of the light emitting elements LD aligned to the light emitting area EMA of the first sub-pixel S-PXL1.

In one or more example embodiments of the present disclosure, by forming the light conversion pattern QDP on the light emitting elements LD after the alignment of the light emitting elements LD is completed in the light emitting area EMA of the first sub-pixel S-PXL1, it is possible to prevent the light emitting elements LD from deviating from an aligned position. When there is an empty gap (or space) between the first insulation layer INS1 and the light emitting elements LD before forming the light conversion pattern QDP, the empty gap may be filled with the light conversion pattern QDP while forming the light conversion pattern QDP as shown in FIG. 11B.

In one or more example embodiments of the present disclosure, the light conversion pattern QDP may be formed on each of the light emitting elements LD so that the active layer 12 of each of the light emitting elements LD does not come into contact with an external conductive material. The light conversion pattern QDP may cover only a portion of the surface of each of the light emitting elements LD, and may expose both ends EP1 and EP2 of each of the light emitting elements LD to the outside.

In one or more example embodiments, the light conversion pattern QDP may include a first light conversion pattern QDP1 and a second light conversion pattern QDP2. The first light conversion pattern QDP1 may convert blue light into red light and emit the red light, the second light conversion pattern QDP2 may convert blue light into green light and emit the green light, and a first scattering pattern SCP described later may transmit blue light as it is.

Referring to FIGS. 7, 8 and 11A, the first light conversion pattern QDP1 may include a first base resin QDP1_1 and a first wavelength conversion particle QDP1_2 dispersed in the first base resin QDP1_1, and the second light conversion pattern QDP2 may include a second base resin QDP2_1 and a second wavelength conversion particle QDP2_2 dispersed in the second base resin QDP2_1.

Each of the light conversion patterns QDP1 and QDP2 may further include scattering particles dispersed in each of the base resins QDP1_1 and QDP2_1. The scattering particles may be metal oxide particles such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), tin oxide ($SnO_2$), and the like, or may be organic particles such as acrylic resin, urethane resin, and the like. Therefore, a path length of light transmitting the light conversion pattern QDP may be increased, and color conversion efficiency by the light conversion pattern QDP may be increased.

In some example embodiments, a thickness of the light conversion pattern QDP may be 3 μm to 15 μm. When the light conversion pattern QDP is formed to have a thickness of 3 μm or more, color conversion efficiency of light transmitting the light conversion pattern QDP may be improved. In some example embodiments, an upper limit of the thickness of the light conversion pattern QDP may be about 15 μm from the viewpoint of process ease.

In some example embodiments, the content of the first wavelength conversion particles QDP1_2 and the second wavelength conversion particles QDP2_2 included in the first light conversion pattern QDP1 and the second light conversion pattern QDP2 may be 10% to 60%. In one or more example embodiments, the content of the scattering particles included in the first light conversion pattern QDP1 and the second light conversion pattern QDP2 may be less than 5%. For example, the content of the scattering particle may be 2% or less. When the content of the scattering particles in the light conversion pattern QDP is 5% or more, transparency of the light conversion pattern QDP is lowered, so that light extraction efficiency may be lowered.

Each of the base resins QDP1_1 and QDP2_1 is not particularly limited as long as it is a material having a high light transmittance and excellent dispersion property for each wavelength conversion particle QDP1_2 and QDP2_2, and the scattering particle. For example, each base resin QDP1_1 and QDP2_1 may include an organic material such as epoxy resin, acrylic resin, cardo resin, imide resin, and the like.

The first wavelength conversion particles QDP12 may convert blue light into red light, and the second wavelength converting particles QDP2_2 may convert blue light into green light. Examples of each of the wavelength conversion particles QDP1_2 and QDP2_2 may be a quantum dot, a quantum rod, or a fluorescent substance. For example, the quantum dot may be a particulate material that emits a specific color while electrons transition from a conduction band to a valence band. When both the first wavelength conversion particle QDP1_2 and the second wavelength conversion particle QDP2_2 are made of quantum dots, a diameter of the quantum dots constituting the first wavelength conversion particle QDP1_2 may be larger than a diameter of the quantum dots constituting the second wavelength conversion particle QDP2_2.

The quantum dot may be a semiconductor nano crystalline material. Because the quantum dot may have a specific band gap depending on a composition and size thereof, it may emit light having a unique wavelength after absorbing light. Examples of the semiconductor nano crystals of the quantum dot may be group IV nano crystals, group II-VI compound nano crystals, group III-V compound nano crystals, group IV-VI nano crystals, or combinations thereof. The quantum dot may have a core-shell structure including a core including the nano crystals described above and a shell surrounding the core.

Referring to FIGS. 7 and 8, the first scattering pattern SCP may include a third base resin SCP_1 and a scattering particle SCP_2. The scattering particle SCP_2 may have an index of refraction different from that of the third base resin SCP_1, and may form an optical interface with the third base resin SCP_1. For example, the scattering particle SCP_2 may be a light scattering particle. The scattering particle SCP_2 is not particularly limited as long as it is a material capable of scattering at least a portion of the transmitted light, but may be, for example, a metal oxide particle or an organic particle. Examples of the metal oxide may be titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like, and the material of the organic particle may include acrylic resin, urethane resin, and the like. The scattering particles SCP_2 may scatter light in a random direction irrespective of an incident direction of incident light without substantially converting a wavelength of light transmitting the first scattering pattern SCP.

The third base resin SCP_1 is not particularly limited as long as it is a material having a high light transmittance and excellent dispersion property for each scattering particle SCP_2. For example, each base resin SCP_1 may include an organic material such as epoxy resin, acrylic resin, cardo resin, or imide resin.

As described above, when the light conversion pattern QDP including the wavelength conversion particles QDP1_2 and QDP2_2 is used as an anchor, the light conversion pattern QDP may not only prevent the light emitting elements LD from deviating from the aligned position, but also convert to any one of red, green, blue and white light from the light emitting element LD emitting blue light. For example, because a separate light conversion layer may not be included on the second substrate SUB2 to be described later, an effect of reducing the thickness of the display device (or display panel) can be expected.

A contact electrode may be located on each of the first and second electrodes EL1 and EL2. The contact electrode may be configured to electrically and stably connect each of the first and second electrodes EL1 and EL2 and the light emitting elements LD corresponding thereto.

The contact electrode may include a first contact electrode CNE1 located on the first electrode EL1 and a second contact electrode CNE2 located on the second electrode EL2. The first and second contact electrodes CNE1 and CNE2 may be made of various transparent conductive materials. For example, the first and second contact electrodes CNE1 and CNE2 may include at least one of various transparent conductive materials, including ITO, IZO, and ITZO, and may be implemented to be substantially transparent or translucent to satisfy a transmittance (e.g., a set transmittance or a predetermined transmittance). However, the material of the first and second contact electrodes CNE1 and CNE2 is not limited to the above-described embodiments, and according to one or more example embodiments, the first and second contact electrodes CNE1 and CNE2 may be made of a various opaque conductive materials.

The first contact electrode CNE1 and the second contact electrode CNE2 may be spaced from each other at the same plane. According to one or more example embodiments of the present disclosure, the first contact electrode CNE1 and the second contact electrode CNE2 may be at the same layer and may include the same material. At this time, the contact electrode CNE may be separated into three areas spaced from each other by the light conversion pattern QDP on the light emitting element LD. For example, the contact electrode CNE may include a first contact electrode CNE1 and a second contact electrode CNE2, and may further include a third contact electrode CNE3 provided and/or formed between the first contact electrode CNE1 and the second contact electrode CNE2. The third contact electrode CNE3 may be a dummy electrode electrically and physically separated from the first and second contact electrodes CNE1 and CNE2.

In one or more example embodiments, as shown in FIG. 11B, the light conversion pattern QDP provided on the light emitting elements LD may have a cross section of an inverted trapezoidal shape in which a length (or width) thereof in the first direction DR1 increases from a lower surface to an upper surface. For example, a cross section of the inverted trapezoidal shape of the light conversion pattern QDP may be formed during a photo process of the light conversion pattern QDP.

However, the present disclosure is not limited thereto, and as shown in FIG. 11C, the first contact electrode CNE1 and the second contact electrode CNE2 may be provided on different layers. For example, the second insulation layer INS2 may be provided on the first contact electrode CNE1. The second insulation layer INS2 may cover the first contact electrode CNE1 located thereunder not to be exposed to the outside. The second contact electrode CNE2 may be formed on the second insulation layer INS2.

In one or more example embodiments of the present disclosure, the first contact electrode CNE1 may be made of a transparent conductive material so that the light emitted from each of the light emitting elements LD and reflected by the first electrode EL1 progresses in the image display direction of the display device without loss. The first contact electrode CNE1 may be provided on the first electrode EL1 and may overlap the first electrode EL1. The first contact electrode CNE1 may be directly located on one region of the first electrode EL1 exposed by the first insulation layer INS1 to be electrically and/or physically connected to the first electrode EL1. In one or more example embodiments, the first contact electrode CNE1 may be directly provided on one end of both ends in each of the light emitting elements LD, and may overlap one end of each of the light emitting elements LD. The first contact electrode CNE1 may electrically and stably connect the first electrode EL1 and one end of both ends in each of the light emitting elements LD. The first contact electrode CNE1 may include a 1-1-th contact electrode CNE1_1 located on the 1-1-th electrode EL1_1 and a 1-2-th contact electrode CNE1_2 located on the 1-2-th electrode EL1_2 (e.g., see FIG. 9).

The second contact electrode CNE2 may be provided on the second electrode EL2 and may overlap the second electrode EL2. The second contact electrode CNE2 may be directly located on one region of the second electrode EL2 exposed by the first insulation layer INS1 to be electrically and/or physically connected to the second electrode EL2. In one or more example embodiments, the second contact electrode CNE2 may be directly provided on the other end of both ends in each of the light emitting elements LD, and may overlap the other end of each of the light emitting elements LD. The second contact electrode CNE2 may electrically and stably connect the second electrode EL2 and the other end of both ends in each of the light emitting elements LD. In one or more example embodiments of the present disclosure, the second contact electrode CNE2 may be provided at the same layer as the first contact electrode CNE1, and may include the same material.

An encapsulation layer ENC may be provided and/or formed on the first and second contact electrodes CNE1 and CNE2. The encapsulation layer ENC may be an inorganic insulation layer including an inorganic material or an organic insulation layer including an organic material. For example, the encapsulation layer ENC may have a structure in which at least one inorganic insulation layer or at least one organic insulation layer is alternately stacked. The encapsulation layer ENC may cover the display element unit DPL as a whole to prevent water or moisture from entering the display element unit DPL including the light emitting elements LD from the outside.

A capping layer may be provided and/or formed in the light emitting area EMA of the first sub-pixel S-PXL1. The capping layer may be provided and/or formed between each of the first and second electrodes EL1 and EL2 and the contact electrode. For example, the capping layer may be provided and/or formed between the first electrode EL1 and the first contact electrode CNE1 and between the second electrode EL2 and the second contact electrode CNE2, respectively. The above-described capping layer may prevent (or protect from) a damage of each of the first and second electrodes EL1 and EL2 due to defects or the like generated during the manufacturing process of the display device, and may further strengthen an adhesion between each of the first and second electrodes EL1 and EL2 and the protective layer PSV. The capping layer may be formed of a transparent conductive material such as indium zinc oxide (IZO) to minimize or reduce the loss of light emitted from each of the light emitting elements LD and reflected in the image display direction of the display device by each of the first and second electrodes EL1 and EL2.

Hereinafter, the second substrate SUB2 will be described. The second substrate SUB2 may include a light blocking pattern BM and color filters CF1, CF2, and CF3.

The second substrate SUB2 is opposite the first base substrate SUB1. The second substrate SUB2 may include at least one material selected from the group consisting of the example materials of the first base substrate SUB1.

The light blocking pattern BM may be located on one surface of the second substrate SUB2 opposite (or facing) the first substrate SUB1. According to one or more example embodiments, the light blocking pattern BM may be formed to overlap the second bank BNK2 formed on the first substrate SUB1 in the thickness direction.

The light blocking pattern BM may block transmission of light. For example, the light blocking pattern BM may serve to prevent (or reduce) color mixing of light emitted from a display surface in each of the first, second, and third sub-pixels S-PXL1, S-PXL2, and S-PXL3. The light blocking pattern BM may include at least one of an opaque organic material, a metal material including chromium, or carbon black.

The color filters CF1, CF2, and CF3 may be located on one surface of the second substrate SUB2. Furthermore, the color filters CF1, CF2, and CF3 may be located on the light blocking pattern BM. The color filters CF1, CF2, and CF3 may be an absorption filter that absorb light of a specific wavelength and transmit light of another specific wavelength.

The color filters CF1, CF2, and CF3 may include first to third color filters CF1, CF2, and CF3. According to one or more example embodiments of the present disclosure, for example, the first to third color filters CF1, CF2, and CF3 may be formed to overlap each of sub-pixels S-PXL1, S-PXL2, and S-PXL3 in the thickness direction. For example, the first color filter CF1 to the third color filter CF3 may be arranged in a matrix form and/or a stripe form along a plurality of pixel rows extending in the first direction DR1 and a plurality of pixel columns extending in the second direction DR2 crossing the first direction DR1.

The first color filter CF1 may block or absorb blue light from among blue light and red light emitted from the first light conversion pattern QDP1. For example, the first color filter CF1 may function as a blue light blocking filter that blocks blue light, and may function as a filter that selectively transmits red light. The first color filter CF1 may include a red colorant.

The second color filter CF2 may block or absorb blue light from among blue light and green light emitted from the second light conversion pattern QDP2. For example, the second color filter CF2 may function as a blue light blocking filter that blocks blue light, and may function as a filter that selectively transmits green light. The second color filter CF2 may include a green colorant.

The third color filter CF3 may transmit blue light emitted from the first scattering pattern SCP. The third color filter CF3 may function as a blue light transmission filter. The third color filter CF3 may include a blue colorant.

The adjacent color filters CF1, CF2, and CF3 may be partially overlapped with each other on the light blocking pattern BM, or may be separately located without being overlapped.

Although not shown, the capping layer may be located on each color filter CF1, CF2, and CF3. The capping layer may be located over the whole surface of the color filters CF1, CF2, and CF3.

The capping layer may prevent impurities such as moisture or air from penetrating from the outside and damaging or contaminating each color filter CF1, CF2, and CF3.

The capping layer may be made of an inorganic material. For example, the capping layer may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and the like.

According to one or more example embodiments of the present disclosure, a filler FM may be located between the first substrate SUB1 and the second substrate SUB2. The filler FM may include a material capable of alleviating external shock or external pressure. For example, the filler FM may be provided as a liquid polymer. The filling material or the filler FM may prevent or substantially prevent a damage of the first substrate SUB1 or the second substrate SUB2 due to external impact or external pressure. In one or more example embodiments, the filler FM can prevent or substantially prevent the light emitting elements LD from being damaged by external shock or external pressure.

Hereinafter, another example embodiment will be described. In the following embodiment, the same configuration as the above-described embodiments will be omitted or simplified, and the differences will be mainly described.

Figure 13A:
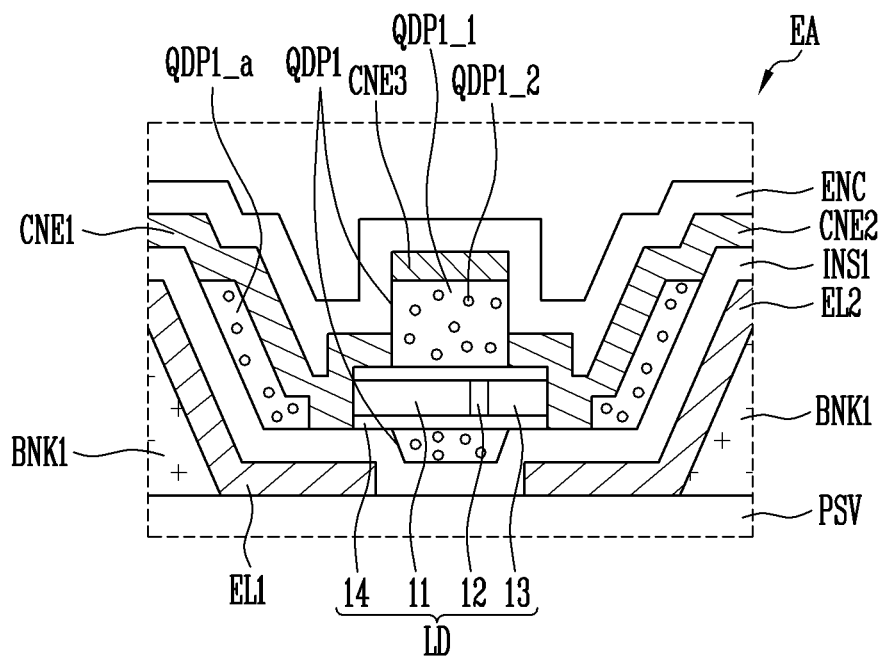
FIGS. 13A, 13B, and 13C are enlarged cross-sectional views of a pixel portion of FIG. 10 according to one or more example embodiments of the present disclosure.
Figure 13B:
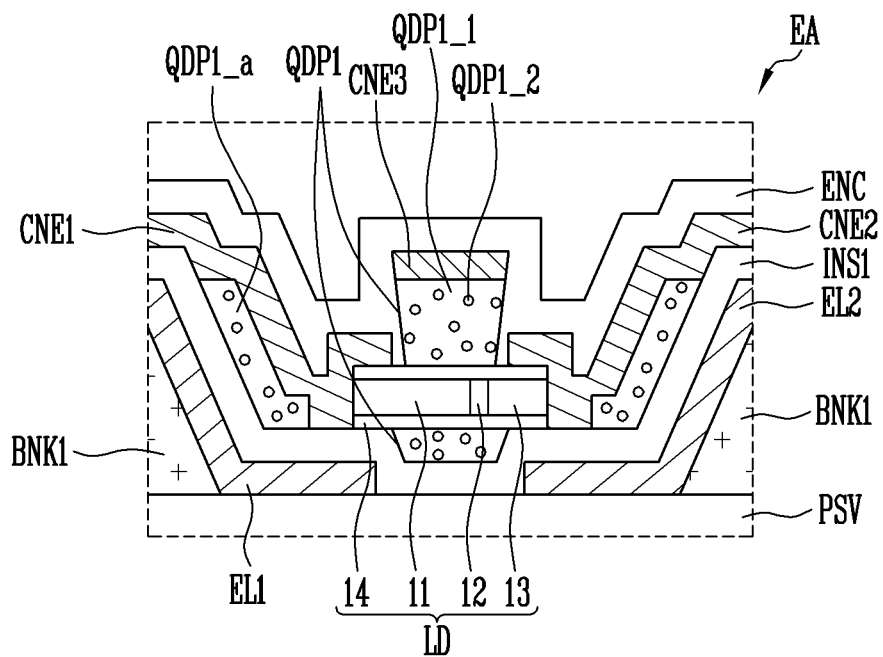
Figure 13C:
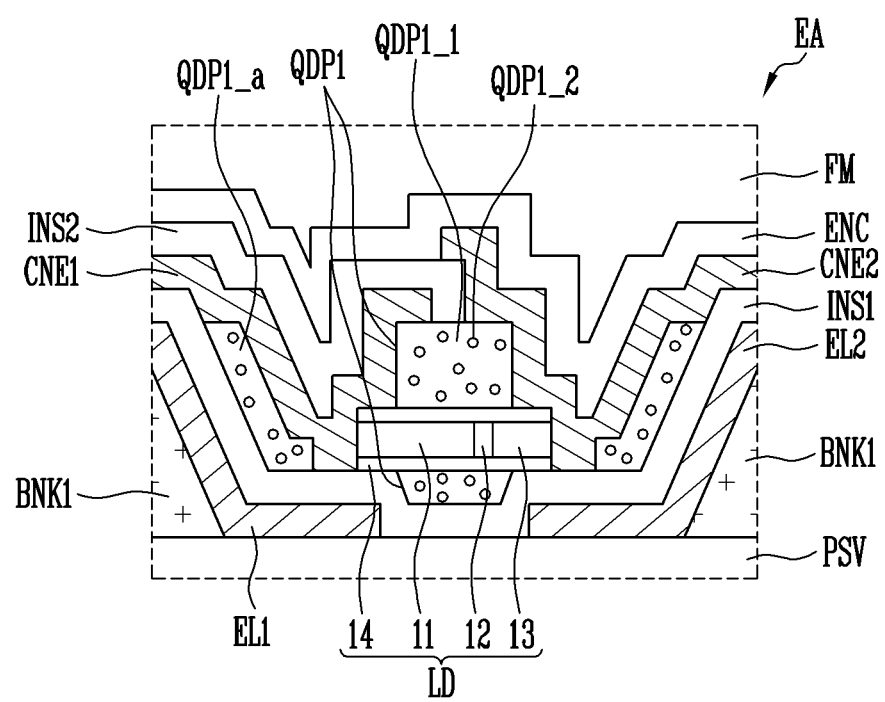
Figure 14A:
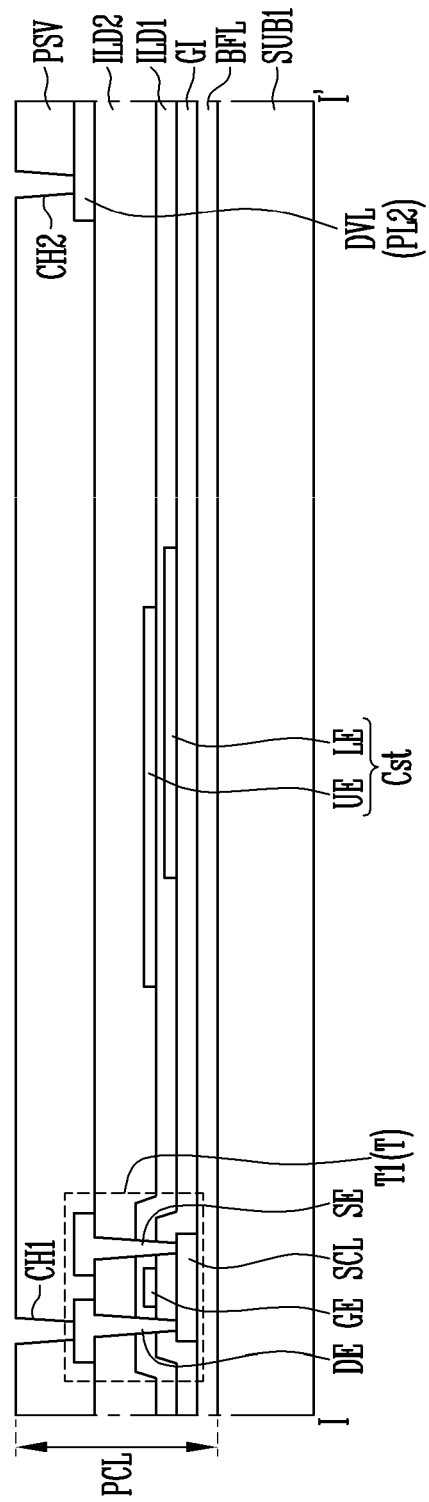
FIGS. 14A-14F are cross-sectional views sequentially showing a manufacturing method of the display device shown in FIG. 10.
Figure 14B:
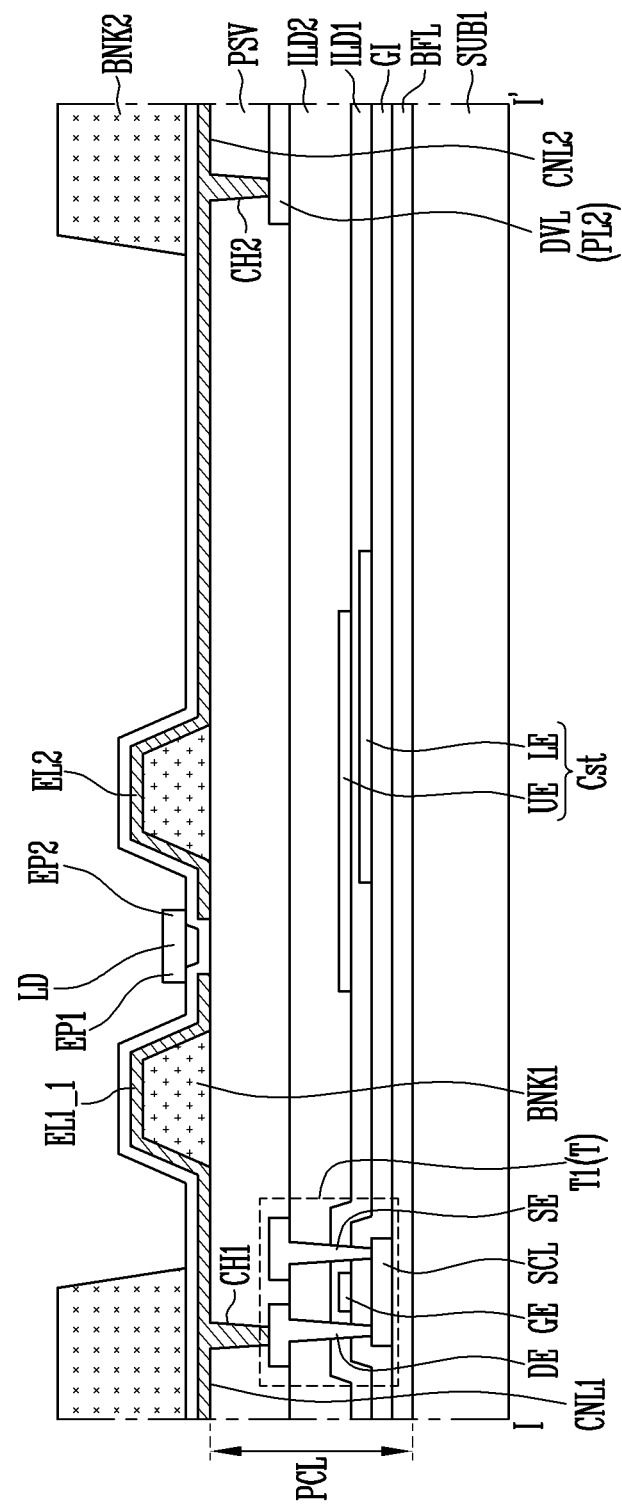
Figure 14C:
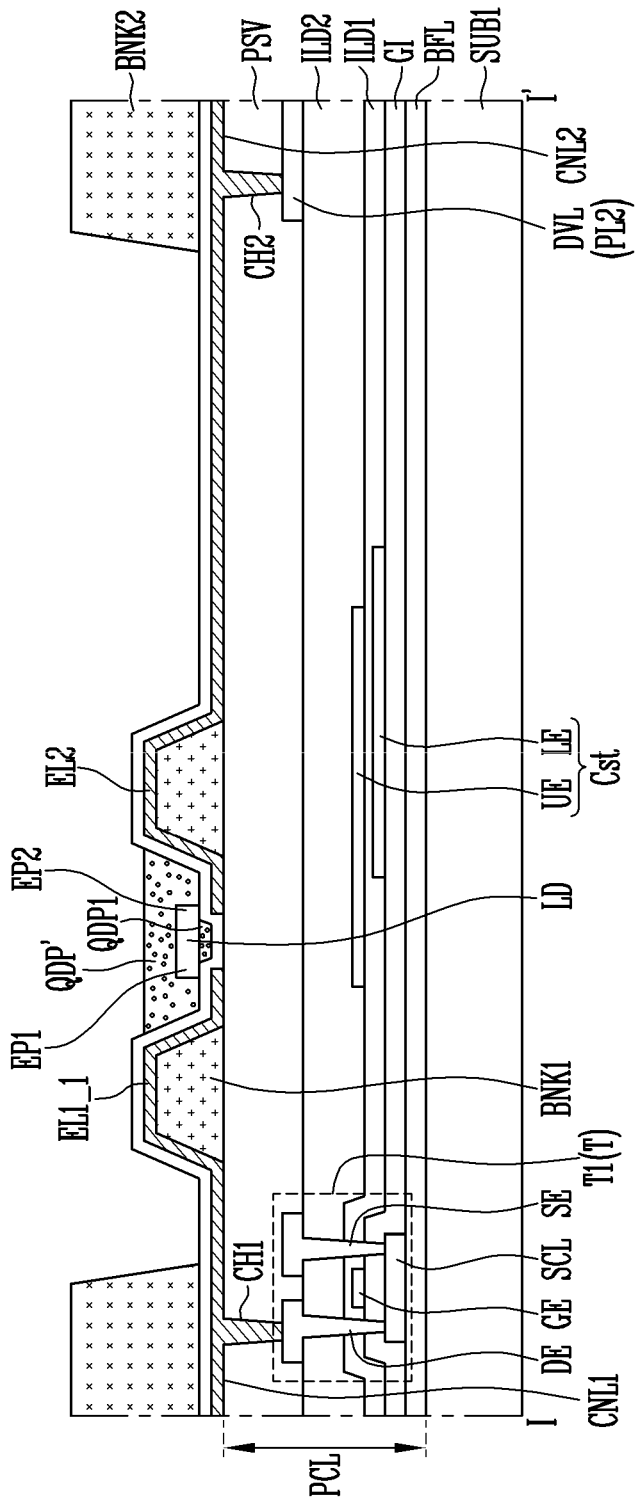
Figure 14D:
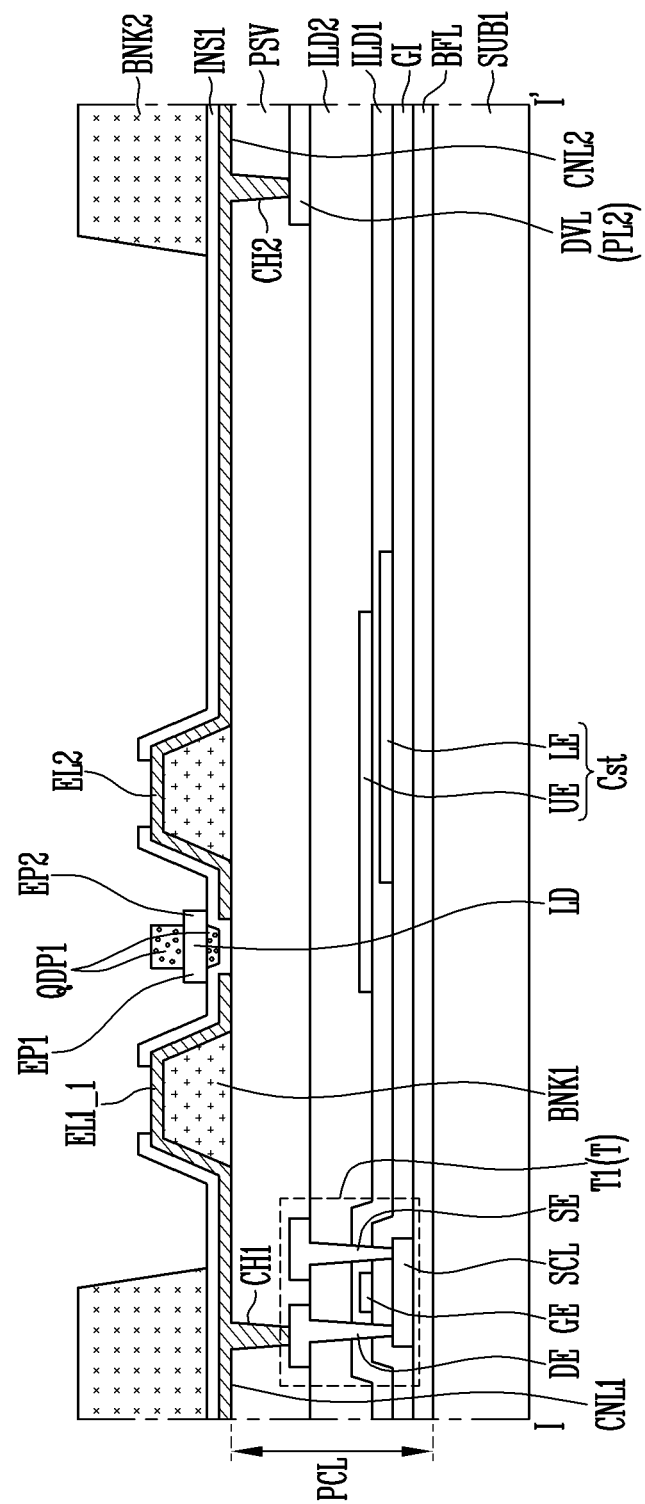
Figure 14E:
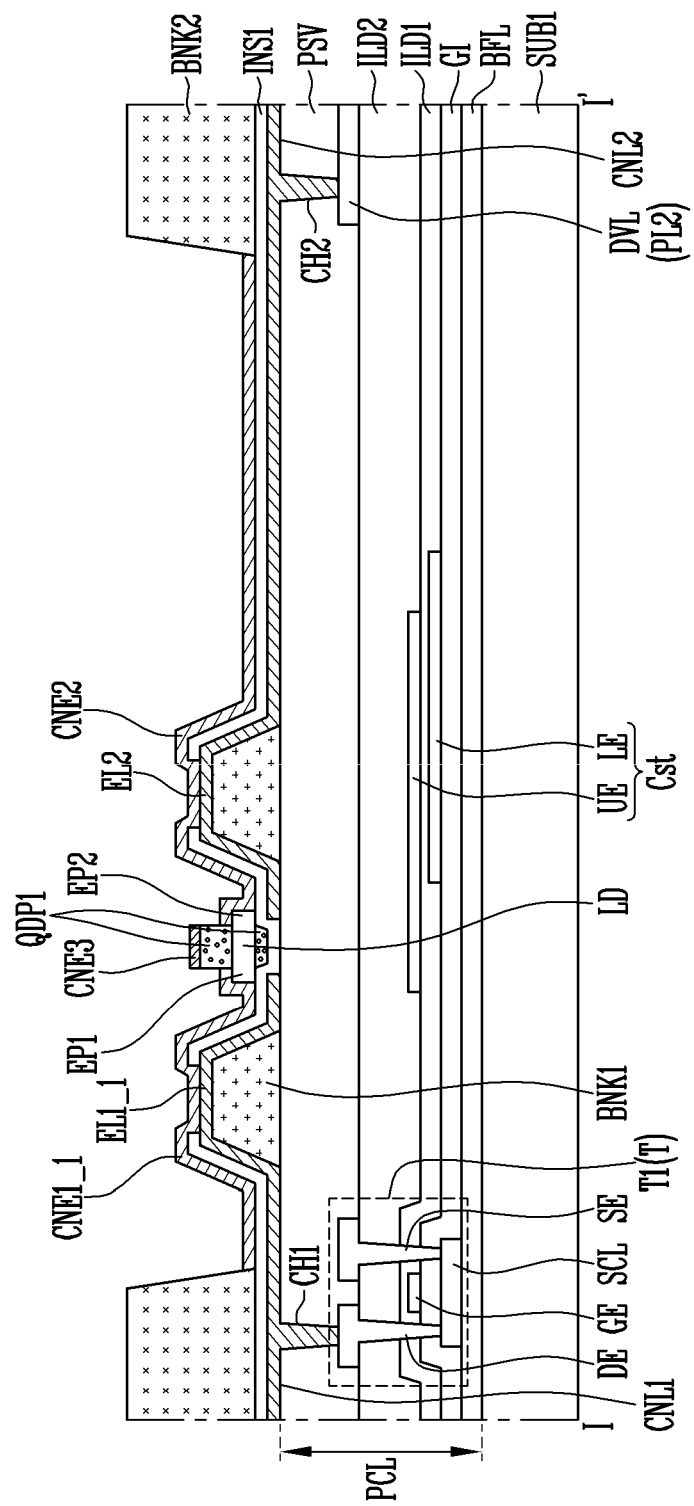
Figure 14F:
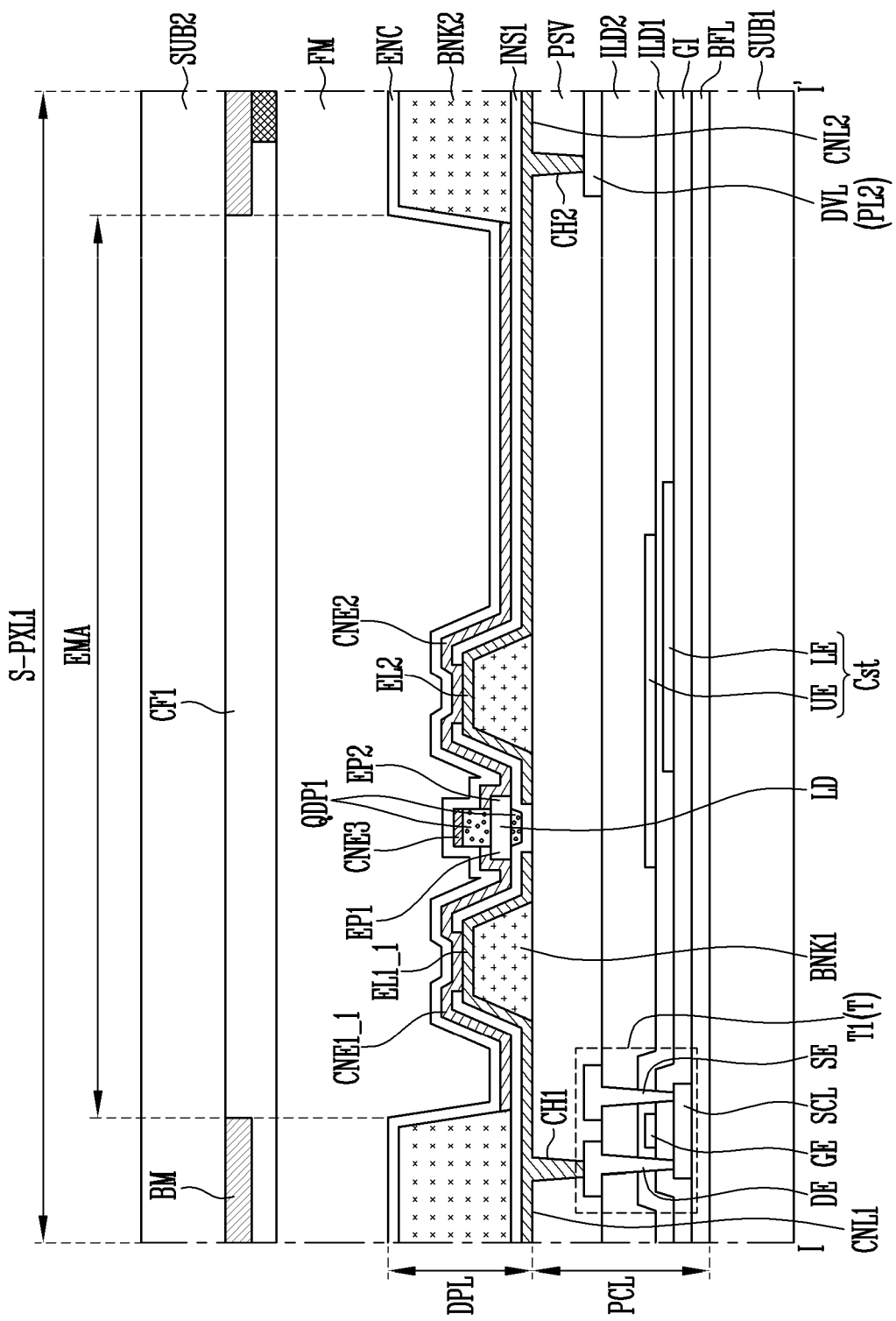

FIGS. 13A, 13B and 13C are enlarged cross-sectional views of a pixel portion of FIG. 10 according to one or more example embodiments of the present disclosure.

An example embodiment shown in FIGS. 13A, 13B, and 13C is different from the example embodiment shown in FIGS. 11A, 11B, and 11C in that it further includes an additional first side light conversion pattern QDP1_$a$ on at least one side of the first bank BNK1.

For example, referring to FIGS. 7, 8, 11A, 11B, 11C, 13A, 13B, and 13C, the first side light conversion patterns QDP1_$a$ may be further provided on the side surfaces of the first bank patterns BNK1 spaced from each other and facing each other, and may be interposed between the first electrode EL1 and the first contact electrode CNE1_1 and between the second electrode EL2 and the second contact electrode CNE2, respectively. At this time, the first insulation layer INS1 may be interposed between the first side light conversion pattern QDP1_$a$ and the first electrode EL1 and between the first side light conversion pattern QDP1_$a$ and the second electrode EL2, respectively.

According to one or more example embodiments, the shortest distance (or thickness) from one surface to the other surface of the first side light conversion pattern QDP1_$a$ may be the same across all sides of the first bank patterns BNK1. In one or more example embodiments, the shortest distance (or thickness) from one surface to the other surface of the first side light conversion pattern QDP1_$a$ may be less than the shortest distance (or thickness) from one surface to the other surface of the first light conversion pattern QDP1.

However, the shortest distance (or thickness) from one surface to the other surface of the first side light conversion pattern QDP1_$a$ is not limited thereto. For example, the shortest distance (or thickness) from one surface to the other surface of the first side light conversion pattern QDP1_$a$ may not be the same across all sides of the first bank patterns BNK1. For example, the distance (or thickness) from one surface of the first side light conversion pattern QDP1_$a$ that contacts the first bank BNK1 to the other surface that is the upper surface of the first side light conversion pattern QDP1_$a$ may increase in the direction from the protective layer PSV toward the filler FM.

In one or more example embodiments, the shortest distance (or thickness) from one surface to the other surface of the first side light conversion patterns QDP1_$a$ may be the same as or larger than the shortest distance (or thickness) from one surface to the other surface of the first light conversion pattern QDP1.

In addition to the first side light conversion pattern QDP1_$a$ provided in the first sub-pixel S-PXL1, a second side light conversion pattern (not shown) may be provided in the second sub-pixel S-PXL2. In one or more example embodiments, a first side scattering pattern (not shown) may be formed and/or provided at the same layer as the first scattering pattern SCP provided in the third sub-pixel S-PXL3.

The first side light conversion pattern QDP1_$a$ may convert blue light into red light and emit the red light, and the second side light conversion pattern (not shown) may convert blue light into green light and emit the green light. The first side scattering pattern (not shown) may transmit blue light as it is. Therefore, light emitted from the side surface of the light emitting element LD can be more effectively converted.

In one or more example embodiments, as shown in FIG. 13B, the first light conversion pattern QDP1 provided on the light emitting elements LD may have a cross section of an inverted trapezoidal shape in which a length (or width) thereof in the first direction DR1 increases from a lower surface to an upper surface. For example, a cross section of the inverted trapezoidal shape of the first light conversion pattern QDP may be formed during a photo process of the light conversion pattern QDP.

However, the present disclosure is not limited thereto, and as shown in FIG. 13C, the first contact electrode CNE1 and the second contact electrode CNE2 may be provided on different layers. For example, the second insulation layer INS2 may be provided on the first contact electrode CNE1. The second insulation layer INS2 may cover the first contact electrode CNE1 located thereunder not to be exposed to the outside. The second contact electrode CNE2 may be formed on the second insulation layer INS2.

Figure 15:
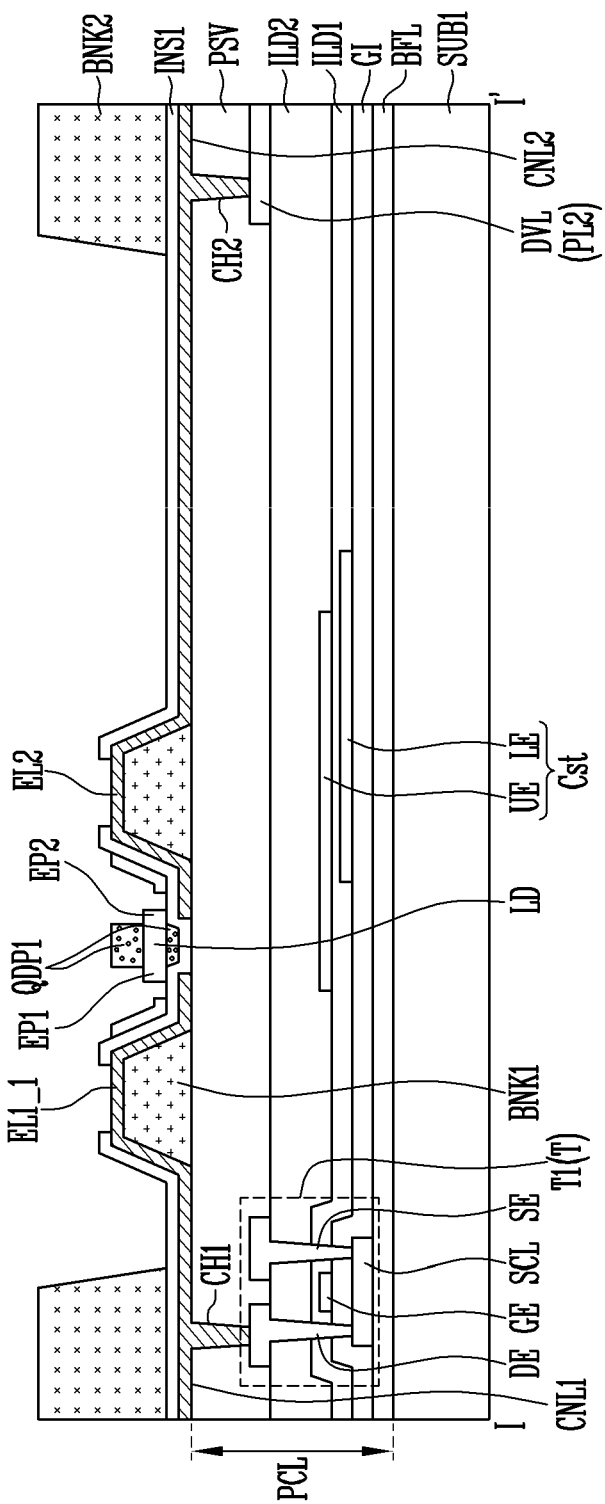
FIG. 15 is a cross-sectional view for illustrating the example embodiment shown in FIGS. 13A and 13B.

FIGS. 14A-14F are cross-sectional views sequentially showing a manufacturing method of the display device shown in FIG. 10. FIG. 15 is a cross-sectional view for illustrating the example embodiment shown in FIGS. 13A and 13B.

Referring to FIGS. 1A-14A, a pixel circuit unit PCL is provided on the first substrate SUB1. The pixel circuit unit PCL may include a first transistor T1, a storage capacitor Cst, a driving voltage line DVL, and a protective layer PSV.

In this case, the protective layer PSV may include a contact hole (hereinafter, referred to as first contact hole CH1) exposing the second terminal DE of the first transistor T1 and a contact hole (hereinafter, referred to as second contact hole CH2) exposing the driving voltage line DVL.

Referring to FIGS. 1A-14B, the light-emitting elements LD may be self-aligned on the first electrode EL1 and the second electrode EL2.

The first bank pattern BNK1 is formed on the pixel circuit part PCL.

The first bank pattern BNK1 may be spaced from each other on the protective layer PSV. In one or more example embodiments of the present disclosure, the first bank pattern BNK1 may be an organic insulation layer.

Next, first and second electrodes EL1 and EL2 including a conductive material having high reflectivity are formed on the protective layer PSV on which the first bank pattern BNK1 is provided.

The first electrode EL1 and the second electrode EL2 may be formed on the first bank pattern BNK1. The first electrode EL1 may include a 1-1-th electrode EL1_1 and a 1-2-th electrode EL1_2.

The 1-1-th electrode EL1_1 may be connected to the second terminal DE of the first transistor T1 through the first contact hole CH1 passing through the protective layer PSV. The second electrode EL2 may be connected to the driving voltage line DVL through the second contact hole CH2 passing through the protective layer PSV.

The first and second electrodes EL1 and EL2 may have a shape corresponding to a shape of the corresponding first bank pattern BNK1. Next, a first insulation material layer INS1 is deposited on a whole surface of the protective layer PSV.

The first insulation material layer may be an inorganic insulation layer including an inorganic material. The first insulation material layer may cover the first and second electrodes EL1 and EL2, and may protect the first and second electrodes EL1 and EL2.

Next, a second bank pattern BNK2 is formed on the pixel circuit unit PCL. The second bank pattern BNK2 may surround at least one side of the peripheral area of the first sub-pixel S-PXL1. The second bank pattern BNK2 may be a structure that defines (or partitions) the light emitting area EMA in each of the first sub-pixel S-PXL1 and the second and third sub-pixels S-PXL2 and S-PXL3 adjacent thereto, and for example, it may be a pixel definition layer.

Next, after applying a suitable voltage (e.g., a set voltage or a predetermined voltage) to each of the first and second electrodes EL1 and EL2 to form an electric field between the first and second electrodes EL1 and EL2, the light emitting elements LD is scattered on the first insulation material layer INS1.

When the rod-shaped light emitting elements LD are injected, an electric field is formed between the 1-1-th electrode EL1_1 and the second electrode EL2 and between the second electrode EL2 and the 1-2-th electrode EL1_2. Therefore, a self-alignment of the rod-shaped light emitting elements LD may be induced.

In one or more example embodiments of the present disclosure, the rod-shaped light emitting elements LD may include a first end EP1 and a second end EP2.

Referring to FIGS. 1A-14C and 14D, a light conversion material layer QDP' is applied on the protective layer PSV on which the first insulation layer INS1 is provided. Subsequently, a first light conversion pattern QDP1 exposing the first end EP1 and the second end EP2 of the light emitting elements LD is formed through a mask process or the like.

According to one or more example embodiments, the light conversion pattern QDP may be provided and/or formed on each of the light emitting elements LD to cover a portion of the upper surface of each of the light emitting elements LD, and to expose both ends EP1 and EP2 of each of the light emitting elements LD to the outside.

When there is an empty gap (or space) between the first insulation layer INS1 and the light emitting elements LD before forming the light conversion pattern QDP, the empty gap may be filled with the light conversion pattern QDP while forming the light conversion pattern QDP.

Next, the first insulation material layer INS1 exposing one region of the 1-1-th electrode and second electrodes EL1_1 and EL2 may be formed by patterning the first insulation material layer through a mask process or the like.

Referring to FIGS. 1A-14E, a contact electrode layer (not shown) is deposited on the protective layer PSV on which the light conversion pattern QDP is provided. In this case, due to a step of the first light conversion pattern QDP1, the contact electrode layer (not shown) is separated into the 1-1-th contact electrode CNE1_1, the second contact electrode CNE2, and the third contact electrode CNE3.

The 1-1-th contact electrode CNE1_1 may cover the 1-1-th electrode EL1_1 and the first end EP1 of the light emitting elements LD, and the second contact electrode CNE2 may cover the second electrode EL2 and the second end EP2 of the light emitting elements LD. The third contact electrode CNE3 may be a dummy electrode electrically and physically separated from the 1-1-th contact electrode and second contact electrode CNE1_1 and CNE2.

Referring to FIGS. 1A-14F, the second substrate SUB2 may be bonded onto the first substrate SUB1. In this case, a filler FM may be interposed between the first substrate SUB1 and the second substrate SUB2.

A light blocking pattern BM and color filters CF1, CF2, and CF3 may be provided on the second substrate SUB2. According to one or more example embodiments, the light blocking pattern BM may be formed to overlap the second bank BNK2 formed on the first substrate SUB1 in the thickness direction. The color filter CF may include first to third color filters CF1, CF2, and CF3. The first to third color filters CF1, CF2, and CF3 may be formed to overlap each of the first to third sub-pixels S-PXL1, S-PXL2, and S-PXL3 in the thickness direction.

The filler FM may be located between the first substrate SUB1 and the second substrate SUB2. The filler FM may be provided in the form of a liquid polymer capable of alleviating external shock or external pressure.

Referring to FIGS. 1A-15, a light conversion material layer QDP' is applied on a protective layer PSV on which the first insulation layer INS1 is provided. Subsequently, a first light conversion pattern QDP1 exposing the first end EP1 and the second end EP2 of the light emitting elements LD is formed through a mask process or the like.

According to one or more example embodiments, the light conversion pattern QDP may be provided and/or formed on each of the light emitting elements LD to cover a portion of the upper surface of each of the light emitting elements LD, and to expose both ends EP1 and EP2 of each of the light emitting elements LD to the outside.

When there is an empty gap (or space) between the first insulation layer INS1 and the light emitting elements LD before forming the light conversion pattern QDP, the empty gap may be filled with the light conversion pattern QDP while forming the light conversion pattern QDP.

In this case, the first side light conversion patterns QDP1_a may be provided on side surfaces of the first bank patterns BNK1 spaced from each other and facing each other. At this time, the first insulation layer INS1 may be interposed between the first side light conversion pattern QDP1_a and the first electrode EL1 and between the first side light conversion pattern QDP1_a and the second electrode EL2, respectively.

While example embodiments of the disclosure are described with reference to the attached drawings, those with ordinary skill in the technical field of the present disclosure pertains will be understood that the present disclosure can be carried out in other specific forms without changing the technical idea or essential features. Accordingly, the above-described example embodiments should be considered in descriptive sense only and not for purposes of limitation.

What is claimed is:
1. A display device comprising:
a first substrate comprising a plurality of unit light emitting areas;
a first electrode and a second electrode in each of the plurality of unit light emitting areas of the first substrate;
a first insulation layer exposing one region of each of the first electrode and the second electrode;
a light emitting element on the first insulation layer and comprising a first end and a second end in a length direction;
light conversion patterns directly adjacent to the light emitting element, covering a portion of an upper surface of the light emitting element, and exposing the first and second ends of the light emitting element;
a first contact electrode on the first electrode and connecting the one region of the exposed first electrode and the first end of the light emitting element; and
a second contact electrode on the second electrode and connecting the one region of the exposed second electrode and the second end of the light emitting element.
2. The display device of claim 1, wherein:
The plurality of unit light emitting areas comprise a first light emitting area, a second light emitting area, and a third light emitting area, and
a first color light is to be emitted from the first light emitting area, a second color light is to be emitted from the second light emitting area, and a third color light is to be emitted from the third light emitting area.

3. The display device of claim 2, wherein the light conversion patterns comprise a first light conversion pattern overlapping the first light emitting area in a thickness direction and comprising a first wavelength conversion particle, a second light conversion pattern overlapping the second light emitting area in the thickness direction and comprising a second wavelength conversion particle, and a first scattering pattern overlapping the third light emitting area in the thickness direction and comprising a scattering particle.

4. The display device of claim 3, wherein:
the first light conversion pattern is configured to convert the first color light to the second color light, and to output the second color light, and
the second light conversion pattern is configured to convert the second color light to the third color light, and to output the third color light.

5. The display device of claim 4, further comprising an encapsulation layer on the first electrode, the second electrode, the light emitting element, and the light conversion patterns.

6. The display device of claim 5, further comprising a second substrate opposite the first substrate,
wherein the second substrate comprises a first color filter overlapping the first light emitting area in the thickness direction and is configured to pass the second color light, a second color filter overlapping the second light emitting area in the thickness direction and is configured to pass the third color light, and a third color filter overlapping the third light emitting area in the thickness direction and is configured to pass the first color light.

7. The display device of claim 6, further comprising a filler located between the first substrate and the second substrate.

8. The display device of claim 6, wherein
the second substrate comprises a light blocking pattern between adjacent ones of the first color filter, the second color filter and the third color filter.

9. The display device of claim 3, wherein
a size of the first wavelength conversion particle is larger than a size of the second wavelength conversion particle.

10. The display device of claim 1, further comprising first bank patterns in each of the plurality of unit light emitting areas of the first substrate and spaced from each other,
wherein the first electrode and the second electrode are located on the first bank patterns.

11. The display device of claim 10, wherein
the light conversion patterns further comprise side light conversion patterns on one side of the first bank patterns facing each other, and are interposed between the first electrode and the first contact electrode and between the second electrode and the second contact electrode.

12. The display device of claim 1, wherein
the light conversion patterns are further located between the first insulation layer and a lower surface of the light emitting element.

13. The display device of claim 1, further comprising
a dummy electrode on an upper surface of the light conversion patterns overlapping the light emitting element in a thickness direction, and electrically and physically separated from the first and second contact electrodes.

14. The display device of claim 1, wherein
the light conversion patterns located to overlap the light emitting element in a thickness direction have a cross-section of an inverted trapezoid shape wherein an upper width in the length direction is larger than a lower width in the length direction.

\* \* \* \* \*